United States Patent
Jung et al.

(10) Patent No.: US 10,719,288 B2
(45) Date of Patent: *Jul. 21, 2020

(54) DISPLAY APPARATUS AND CONTROL METHOD THEREOF

(71) Applicant: SAMSUNG ELECTRONICS CO., LTD., Suwon-si (KR)

(72) Inventors: Kil-soo Jung, Osan-si (KR); Byung-chul Kim, Suwon-si (KR); Sung-yeol Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/556,825

(22) Filed: Aug. 30, 2019

(65) Prior Publication Data

US 2019/0384561 A1 Dec. 19, 2019

Related U.S. Application Data

(63) Continuation of application No. 15/480,824, filed on Apr. 6, 2017, now Pat. No. 10,430,142.

(30) Foreign Application Priority Data

Aug. 3, 2016 (KR) .......... 10-2016-0098711
Dec. 23, 2016 (KR) .......... 10-2016-0178436

(51) Int. Cl.
*G06F 3/14* (2006.01)
*G09G 3/20* (2006.01)
(Continued)

(52) U.S. Cl.
CPC ............ *G06F 3/1446* (2013.01); *G09G 3/20* (2013.01); *G09G 3/2007* (2013.01); *G09G 3/32* (2013.01);
(Continued)

(58) Field of Classification Search
CPC ......... G09G 3/3233; G09G 2320/0233; G09G 2320/043; G09G 2300/026; G09G 2320/0295
See application file for complete search history.

(56) References Cited

U.S. PATENT DOCUMENTS 5,717,417 A * 2/1998 Takahashi ................ G09G 3/32
345/690
6,184,953 B1 2/2001 Greene et al.
(Continued)

FOREIGN PATENT DOCUMENTS

JP 2010-113163 A 5/2010
JP 2014194525 A 10/2014
(Continued)

OTHER PUBLICATIONS

Written Opinion, issued by International Searching Authority in corresponding International Application No. PCT/KR2017/007815, dated Nov. 17. 2017, (PCT/ISA/237).
(Continued)

*Primary Examiner* — Sanjiv D. Patel
(74) *Attorney, Agent, or Firm* — Sughrue Mion, PLLC

(57) ABSTRACT

A display apparatus is provided. The display apparatus includes: a display configured to include a plurality of display modules, a storage configured to store a first luminance correction coefficient corresponding to light-emitting pixels constituting each of the plurality of display modules and a second luminance correction coefficient corresponding to at least one target pixels adjacent to a seam region from among the light-emitting pixels, and a processor configured to apply the second luminance correction coefficient to the target pixel, apply the first luminance correction coefficient to remaining pixels, and drive the display, wherein the second luminance correction coefficient may be a luminance
(Continued)

correction coefficient which is calculated based on a target luminance value to compensate the seam region.

20 Claims, 27 Drawing Sheets

(51) Int. Cl.
  *G09G 3/32* (2016.01)
  *H01L 27/32* (2006.01)
(52) U.S. Cl.
  CPC .......... *G09G 2300/026* (2013.01); *G09G 2310/0232* (2013.01); *G09G 2320/0233* (2013.01); *G09G 2320/0285* (2013.01); *G09G 2320/0626* (2013.01); *G09G 2320/0693* (2013.01); *G09G 2360/145* (2013.01); *H01L 27/3293* (2013.01)

(56) References Cited

U.S. PATENT DOCUMENTS

| | | | |
|---|---|---|---|
| 7,336,277 | B1 | 2/2008 | Clark et al. |
| 8,482,509 | B2 | 7/2013 | Choe et al. |
| 8,638,339 | B2 | 1/2014 | Choe et al. |
| 9,357,209 | B2 | 5/2016 | Kim et al. |
| 9,529,562 | B2 | 12/2016 | Takahashi et al. |
| 2010/0053450 | A1* | 3/2010 | Hanamura ............ G06F 3/1446 348/687 |
| 2010/0245397 | A1* | 9/2010 | Choe ..................... G09G 3/342 345/690 |
| 2011/0025232 | A1 | 2/2011 | Kee et al. |
| 2011/0025728 | A1 | 2/2011 | Baba et al. |
| 2011/0102452 | A1 | 5/2011 | Yun et al. |
| 2011/0134150 | A1 | 6/2011 | Imamura |
| 2012/0038660 | A1 | 2/2012 | Han et al. |
| 2012/0206502 | A1 | 8/2012 | Jung et al. |
| 2014/0240201 | A1 | 8/2014 | Takahashi et al. |
| 2014/0320042 | A1* | 10/2014 | Yamamoto ......... H05B 33/0896 315/294 |
| 2015/0035870 | A1 | 2/2015 | Ooya |
| 2015/0146017 | A1 | 5/2015 | Kim et al. |
| 2015/0301781 | A1 | 10/2015 | Ekkaia et al. |
| 2016/0057318 | A1* | 2/2016 | Hsieh ..................... H04N 5/202 345/690 |
| 2016/0179453 | A1* | 6/2016 | Jepsen .................. G06F 3/1446 345/690 |
| 2016/0210103 | A1* | 7/2016 | Yoshizumi ............ G06F 3/1446 |

FOREIGN PATENT DOCUMENTS

| | | |
|---|---|---|
| KR | 10-2007-0049662 A | 5/2007 |
| KR | 10-0741970 B1 | 7/2007 |
| KR | 10-0741971 B1 | 7/2007 |
| KR | 10-2010-0106703 A | 10/2010 |
| KR | 10-2011-0047397 A | 5/2011 |
| KR | 10-2012-0015578 A | 2/2012 |
| KR | 10-2012-0092790 A | 8/2012 |
| KR | 10-2012-0135946 A | 12/2012 |
| KR | 10-1217554 B1 | 1/2013 |
| KR | 10-2013-0044081 A | 5/2013 |
| KR | 1020150059268 A | 6/2015 |
| WO | 2013/051063 A1 | 4/2013 |

OTHER PUBLICATIONS

International Search Report, issued by International Searching Authority in corresponding International Application No. PCT/KR2017/007815, dated Nov. 17, 2017, (PCT/ISA/210).
Communication dated Feb. 12, 2019, issued by the European Patent Office for European Patent Application No. 17837173.8.

* cited by examiner

FIG. 6A
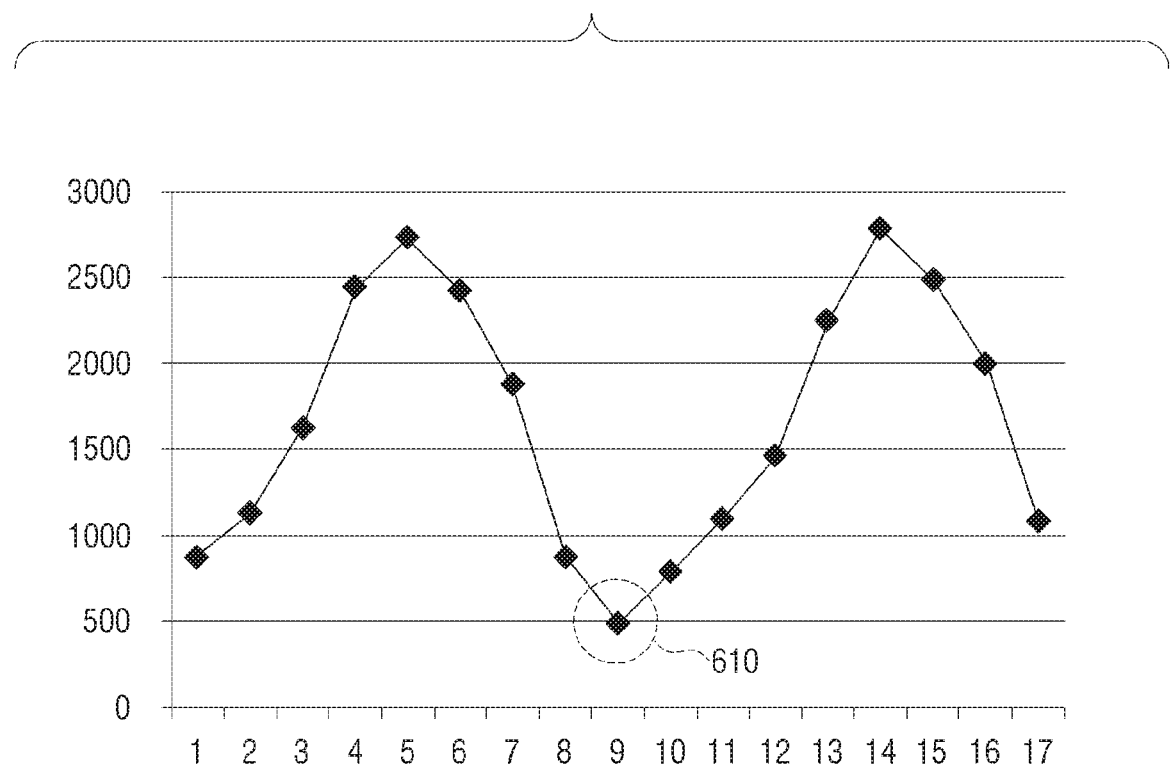
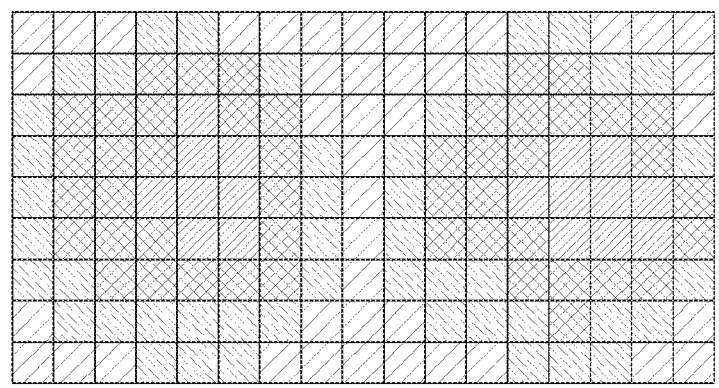

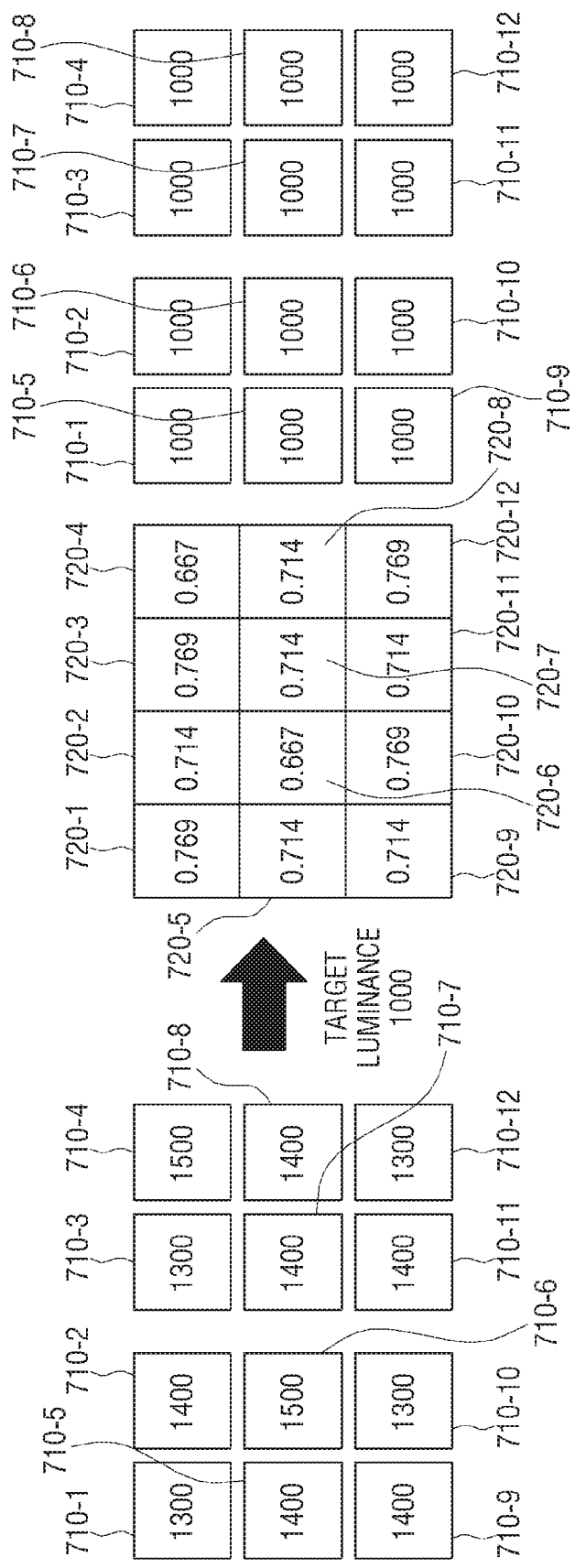

FIG. 8A

| GRAYSCALE | LUMINANCE |
|---|---|
| 255 | 1000 |
| 254 | 995.68 |
| 253 | 991.76 |
| ...... | |
| 128 | 501.76 |
| ...... | |
| 2 | 7.84 |
| 1 | 3.92 |
| 0 | 0 |

FIG. 10

| GRAYSCALE | LUMINANCE |
|---|---|
| 255 | 1000 |
| ...... | |
| 132 | 516.78 |
| ...... | |
| 128 | 501.76 |
| ...... | |

| GRAYSCALE | LUMINANCE |
|---|---|
| 255 | 1039 |
| ...... | |
| 128 | 520.96 |
| 127 | 516.89 |
| ...... | |

DISPLAY APPARATUS AND CONTROL METHOD THEREOF

CROSS-REFERENCE TO RELATED APPLICATIONS

This application is a continuation application of U.S. application Ser. No. 15/480,824, filed Apr. 6, 2017, which claims priority from Korean Patent Application Nos. 10-2016-0098711, filed on Aug. 3, 2016, and 10-2016-0178436, filed on Dec. 23, 2016, in the Korean Intellectual Property Office, the disclosures of which are incorporated herein by reference in their entireties.

BACKGROUND

Field

Apparatuses and methods consistent with exemplary embodiments relate to a display apparatus and a control method of an electronic apparatus.

Description of Related Art

A light emitting diode (LED) is a semiconductor light emitting element for converting an electric current into light. In recent years, LEDs have been increasingly used as a light source for a display, a light source for a vehicle, and a light source for illumination due to its increased luminance, and may be implemented to efficiently emit white light.

However, when a display panel is configured using a plurality of LED modules (or cabinets), a dark line (or emission line) may be generated due to an assembly tolerance between the LED modules.

SUMMARY

One or more exemplary embodiments may overcome the above disadvantages and other disadvantages not described above. However, it is understood that one or more exemplary embodiments are not required to overcome the disadvantages described above, and may not overcome any of the problems described above.

According to an aspect of an exemplary embodiment, there is provided a display apparatus including: a display comprising a plurality of display modules, a storage configured to store a first luminance correction coefficient corresponding to light-emitting pixels and a second luminance correction coefficient corresponding to at least one target pixel adjacent to a seam region from among the light-emitting pixels; and a processor configured to drive the display by applying the second luminance correction coefficient to the target pixel adjacent to the seam region and applying the first luminance correction coefficient to remaining pixels, wherein the second luminance correction coefficient may be a luminance correction coefficient which is calculated based on a target luminance value to compensate the seam region.

Here, the second luminance correction coefficient may be calculated based on the target luminance value to compensate the seam region while the first luminance correction coefficient is applied to each of the light-emitting pixels.

The target luminance value may correspond to a compensation grayscale value to compensate the seam region.

The compensation grayscale value may be calculated by modeling a distribution of light intensity by each of a plurality of target pixels adjacent to the seam region.

The compensation grayscale value may model light intensity distribution corresponding to each of the plurality of target pixels adjacent to the seam region in a form of Gaussian function and may be calculated so that a luminance value at an intersection point of each of modeled Gaussian function is a predetermined luminance value.

The predetermined luminance value may be a luminance value at an intersection point of Gaussian function corresponding to each of a plurality of adjacent pixels without a seam region.

The first luminance correction coefficient may be calibrated for uniformity among the light-emitting pixels constituting each of the plurality of display modules.

The processor may apply the second luminance correction grayscale to the target pixel, compare a luminance value of each grayscale of an input image according to the second luminance correction coefficient and a luminance value of each grayscale of an input image according to the first luminance correction coefficient, correct a grayscale value of the input image and render an output image.

The processor, when a grayscale value of an image displayed on the target pixel is less than or equal to a predetermined grayscale value, may correct the grayscale value of the input image and renders the output image, wherein the grayscale value of the input image may be corrected such that the luminance value adjusted according to the second luminance correction coefficient is adjusted upward or downward based on the grayscale value of the image displayed on the target pixel.

The target pixel may include at least one pixel spaced by a predetermined gap from among the plurality of pixels adjacent to the seam region on the display.

The target pixel may include a plurality of first and second pixels arranged in a zig-zag pattern from among a plurality of first pixels included in a pixel region adjacent to one side of the seam region and a plurality of second pixels included in a pixel region adjacent to the other side of the ream region.

The display module may be implemented as an LED module including at least one LED element or an LED cabinet in which LED modules are connected to one another.

In the meantime, according to an exemplary embodiment, there is provided a controlling method of an electronic apparatus which stores a first luminance correction coefficient corresponding to light-emitting pixels constituting each of a plurality of display modules included in a display. The method may include calculating a target luminance value for compensating a seam region by applying the first luminance correction coefficient to the light-emitting pixel, and calculating a second luminance correction coefficient corresponding to at least one target pixel adjacent to the seam region based on the target luminance value.

The target luminance value may correspond to a compensation grayscale value to compensate the seam region, wherein the first luminance correction coefficient may be calibrated for uniformity among the light-emitting pixels constituting each of the plurality of display modules.

The calculating the second luminance correction coefficient may include calculating the compensation grayscale value by modeling a distribution of light intensity corresponding to each of a plurality of target pixels adjacent to the seam region.

The calculating the second luminance correction coefficient may include modeling light intensity distribution corresponding to each of the plurality of target pixels adjacent to the seam region in a form of Gaussian function; and calculating the compensation grayscale value so that a luminance value at an intersection point of each of modeled Gaussian function is a predetermined luminance value.

The predetermined luminance value may be a luminance value at an intersection point of Gaussian function corresponding to each of a plurality of adjacent pixels without a seam region.

The method may further include determining at least one pixel spaced by a predetermined gap from among the plurality of pixels adjacent to the seam region on the display as the target pixel.

The determining the target pixel may include determining a plurality of first and second pixels arranged in a zig-zag pattern from among a plurality of first pixels included in a pixel region adjacent to one side of the seam region and a plurality of second pixels included in a pixel region adjacent to the other side of the ream region as the target pixels.

The method may include calculating luminance amount that increase in luminance according to the second luminance correction efficient of the target pixel is transferred to at least one adjacent pixels which are not selected as the target pixel; and adjusting the first luminance correction coefficient of the adjacent pixel based on the calculated luminance amount.

As described above, removing the seam region for input signal of all grayscale is available and thus, improved image quality can be provided to a user.

Additional and/or other aspects and advantages of the invention will be set forth in part in the description which follows and, in part, will be obvious from the description, or may be learned by practice of the invention.

BRIEF DESCRIPTION OF THE FIGURES

The above and/or other aspects of the present disclosure will be more apparent by describing certain exemplary embodiments with reference to the accompanying drawings, in which:

FIGS. 5A, 5B, 6A, 6B, 6C, 6D, 7, 8A, 8B, 9A and 9B are views to illustrate a method for compensating for a luminance correction coefficient according to an exemplary embodiment;

FIG. 10 is a view to illustrate a method for correcting an image grayscale according to an exemplary embodiment;

DETAILED DESCRIPTION

Hereinafter, various exemplary embodiments will be described in detail with reference to the accompanying drawings.

Figure 1:
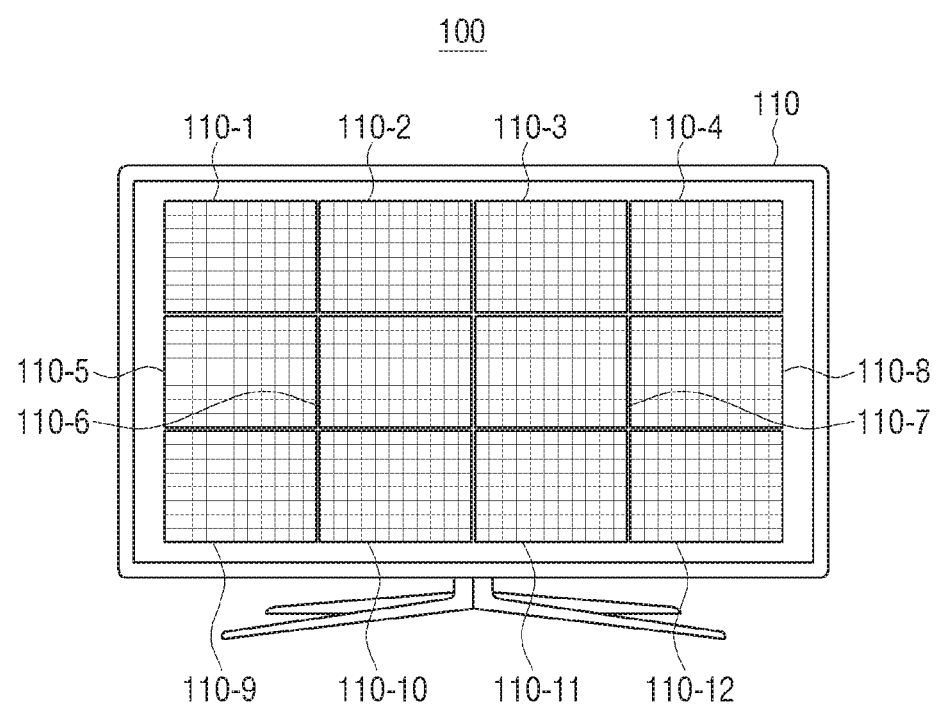
FIG. 1 is a view to schematically illustrate a configuration of a display apparatus according to an exemplary embodiment.

FIG. 1 is a view to schematically illustrate a configuration of a display apparatus according to an exemplary embodiment.

As shown in FIG. 1, the display apparatus 100 according to an exemplary embodiment may be implemented by physically connecting a plurality of display modules 110-1, 110-2, 110-3, 110-4, . . . 110-12. Herein, each of the plurality of display modules may include a plurality of pixels which are arranged in a matrix form. According to an exemplary embodiment, the plurality of pixels may be self-light emitting pixels. In particular, the display module may be implemented by using a light emitting diode (LED) module which includes a plurality of LED pixels, or by using an LED cabinet in which a plurality of LED modules are connected with one another. However, this should not be considered as limiting. For example, the display module may be implemented by using a liquid crystal display (LCD), an organic LED (OLED), an active-matrix OLED (AMOLED), a plasma display panel (PDP), or the like. However, in the following description, it is assumed that each of the display modules is implemented by using an LED module or an LED cabinet, for convenience of explanation.

When a display 110 is configured using a unit display module as described above, the display 110 may be implemented in various sizes and/or shapes, but a seam may be visible due to an assembly tolerance of the display module. Herein, the seam may be visible in the form of a dark line or an emission line, but, in the following description, it is assumed that the seam is visible in the form of the dark line.

To solve the above-mentioned problem, the display apparatus according to an exemplary embodiment may adjust not only a grayscale of an image displayed on each display module, but also a luminance value (for example, a maximum luminance value corresponding to a maximum grayscale) of a pixel constituting each display module. Hereinafter, various exemplary embodiments will be described.

Figure 2A:
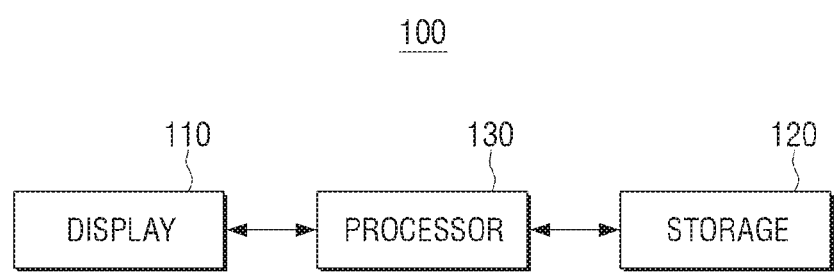
FIG. 2A is a block diagram showing a configuration of a display apparatus according to an exemplary embodiment.

FIG. 2 is a block diagram illustrating a configuration of a display apparatus according to an exemplary embodiment.

Referring to FIG. 2, the display apparatus 100 includes a display 110, a storage 120, and a processor 130.

The display 110 includes a plurality of display modules. In particular, the display 110 may be configured by connecting a plurality of display modules with one another. Herein, each of the plurality of display modules may include a plurality of pixels arranged in a matrix form. According to an exemplary embodiment, the display 110 may be implemented by using a plurality of self-light emitting pixels, such as LED modules (LED modules each including at least one LED element) and/or a plurality of LED cabinets. In addition, the LED module may include a plurality of LED pixels, and according to an exemplary embodiment, the LED pixels may be implemented by using red, blue and greed (RGB) LEDs, and the RGB LEDs may include a red LED, a green LED, and a blue LED.

The storage 120 stores various data necessary for the operation of the display apparatus 100.

The storage 120 may be implemented by using a nonvolatile memory, a volatile memory, a hard disk drive (HDD) or a solid state drive (SSD), a memory card (for example, a micro Secure Digital (SD) card, a Universal Serial Bus (USB) memory, or the like) mounted in the display apparatus 100, an external memory (for example, a USB memory or the like) connectable to an external input port, or the like.

The storage 120 may store information on a binning group, information on maximum luminance for each pixel, information on color for each pixel, or the like. The binning group may be a group of LED pixels having most similar characteristics (luminance, color coordinates, or the like).

In particular, the storage 120 may store a luminance correction coefficient corresponding to at least one light emitting pixel constituting at least one of the plurality of display modules.

According to an exemplary embodiment, the storage 120 may store a first luminance correction coefficient corresponding to each of the light emitting pixels constituting each of the plurality of display modules.

Figure 3:
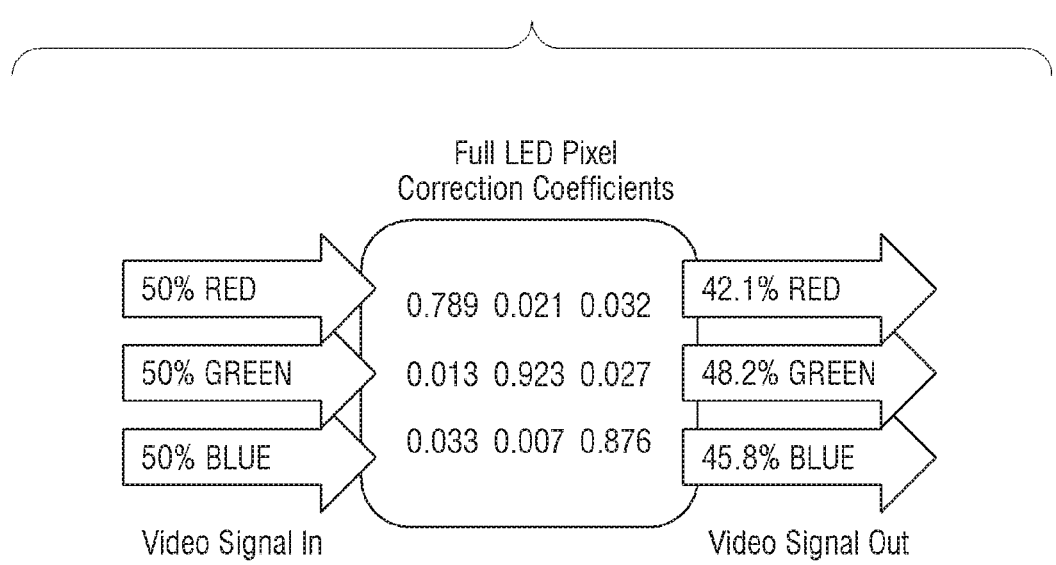
FIG. 3 is a view illustrating an example of a luminance correction coefficient according to an exemplary embodiment.

For example, when the light emitting pixel is implemented by using a self-light emitting pixel, such as an LED pixel, the luminance is reduced through calibration by utilizing luminance correction coefficients to match maximum luminance with reference luminance for the sake of uniformity between the plurality of LED pixels. In this case, the first luminance correction coefficients may have a 3×3 matrix form to realize target red, blue and green levels, as shown in FIG. 3. Uniformity may be achieved by matching up the maximum luminance with the reference luminance by applying different luminance correction coefficients to the respective pixels. In addition, the target luminance may be achieved based on parameters of the 3×3 matrix form corresponding to red, blue and green elements, and also, color temperature may be calibrated to have uniformity.

The reference luminance may be set based on an LED pixel having the lowest luminance, but is not limited to this. For example, a luminance value of about 90% of the LED pixel having the lowest maximum luminance value may be set as the reference luminance value.

In addition, the storage 120 may store the second luminance correction coefficient corresponding to at least one target pixel adjacent to the seam region from among the light emitting pixels constituting each of a plurality of display modules. Here, the second luminance correction coefficient may be calculated based on the target luminance value for compensating for the seam region. In addition, the second luminance correction coefficient may be calculated based on the target luminance value for compensating the seam region while the uniformity is implemented by applying the first luminance correction coefficient to each of the light emitting pixels. The target luminance value may correspond to a compensation grayscale value to compensate the seam region. The compensation grayscale value may be calculated by modeling a distribution of light intensity by each of a plurality of target pixels adjacent to the seam region. The compensation grayscale value may model light intensity distribution corresponding to each of the plurality of target pixels adjacent to the seam region in a form of Gaussian function and may be calculated so that a luminance value at an intersection point of each of modeled Gaussian function is a predetermined luminance value.

In addition, the storage 120 may further store information on the number of pixels constituting each of the plurality of display modules, a pixel size, and a gap between the pixels. For example, the storage 120 may store information indicating that the LED module includes M×N pixels, the pixel size is 2.1 mm, and a distance between the centers of the pixels is 2.5 mm.

The processor 130 controls the overall operation of the display apparatus 100. Herein, the processor 130 may include one or more of a central processing unit (CPU), a controller, an application processor (AP), a communication processor (CP), and an ARM processor.

In addition, the processor 130 may include a graphic processing unit (GPU) for processing graphics corresponding to an image. The processor 130 may be implemented by using a system on chip (SoC) including a core and a GPU. The processor 130 may include a single core, a dual core, a triple core, a quad core, and a core of a multiple thereof.

According to an exemplary embodiment, the processor 130 may drive a display by applying the second luminance correction coefficient to the target pixel and apply the first luminance correction coefficient to the remaining pixel. Here, the target pixel may be at least one light emitting pixel adjacent to the seam region. The target pixel may include at least one pixel spaced by a predetermined gap from among the plurality of pixels adjacent to the seam region on the display 110. The target pixel may include a plurality of first and second pixels arranged in a zig-zag pattern from among a plurality of first pixels included in a pixel region adjacent to one side of the seam region and a plurality of second pixels included in a pixel region adjacent to the other side of the ream region.

The second luminance correction coefficient may be calculated based on the target luminance value for compensating for the seam region as described above.

In addition, the processor 130 may apply the second luminance correction grayscale to the target pixel, compare a luminance value of each grayscale of an input image according to the second luminance correction coefficient and a luminance value of each grayscale of an input image according to the first luminance correction coefficient, correct a grayscale value of the input image and render an output image.

The processor 130, when a grayscale value of an image displayed on the target pixel is less than or equal to a predetermined grayscale value, may correct the grayscale value of the input image and renders the output image, wherein the grayscale value of the input image may be corrected such that the luminance value adjusted according to the second luminance correction coefficient is adjusted upward or downward based on the grayscale value of the image displayed on the target pixel.

According to an exemplary embodiment, the first and second luminance correction factor may be calculated by the processor 130. That is, the processor 130 may receive an image photographed by an external photographing device, and at least one of the first and second luminance correction coefficients may be calculated based on the processor 130.

According to an exemplary embodiment, the processor 130 may obtain, from the storage 120, a first luminance correction coefficient of at least one target pixel adjacent to a seam region of the display 110. Then, the processor 130 may compensate for the obtained first luminance correction coefficient based on a compensation grayscale value for removing the seam region and obtain a second luminance correction coefficient, and apply the second luminance correction coefficient to the target pixel.

According to another exemplary embodiment, the first and second luminance correction coefficients may be calculated by an electronic device (for example, colormeter, color difference meter, PC, etc.) which is different from the display apparatus 100. In this case, an electronic device may have a camera for photographing the display 110 or receive an image photographed from an external photographing device.

Figure 2B:
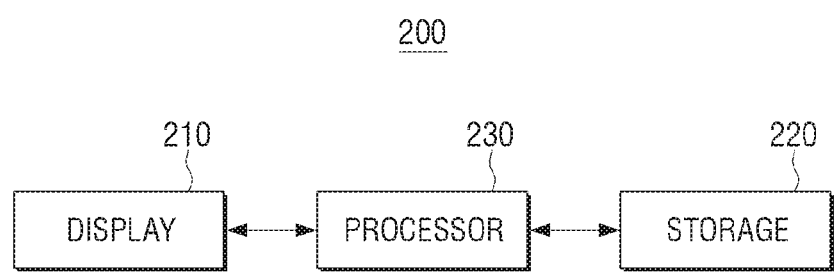
FIG. 2B is a block diagram showing a configuration of an electronic apparatus according to an exemplary embodiment.

FIG. 2B is a block diagram illustrating a configuration of an electronic device according to an exemplary embodiment. According to FIG. 2B, an electronic device 200 includes a camera 210, a storage 220, and a processor 230. FIG. 2B assumes that the camera 210 is provided on the electronic device 200. Here, the storage 220 may store data which is the same as the storage 210 provided on the display apparatus 100.

Detecting a Seam Region

Figure 4A:
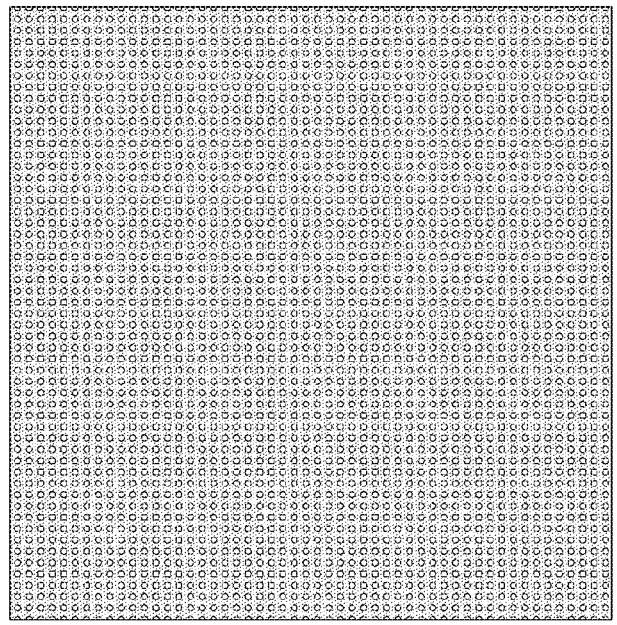
FIGS. 4A, 4B, 4C and 4D are views to illustrate a method for detecting a seam region according to an exemplary embodiment.

According to an exemplary embodiment, a processor 230 may derive an inter-pixel distance based on measurement data determined based on a photograph of display 110 of the display apparatus 100 through the camera 210, the number of pixels in the module, the pixel size and the inter-pixel gap which are obtained from a storage 220, and detect the seam region based on the derived inter-pixel distance. Herein, the measurement data may be data which is a based on a photograph of the display 110 when the display 110 displays a sample image (for example, a full white image) having a maximum grayscale value in each pixel region, for example, a 255 grayscale value (when an image has a grayscale of 256 steps for each color signal of RGB). In addition, the measurement data may be data which photographs a sample image while the first luminance correction coefficient is applied to each light-emitting pixel for uniformity. FIG. 4A illustrates an example 410 of measurement data.

Figure 4B:
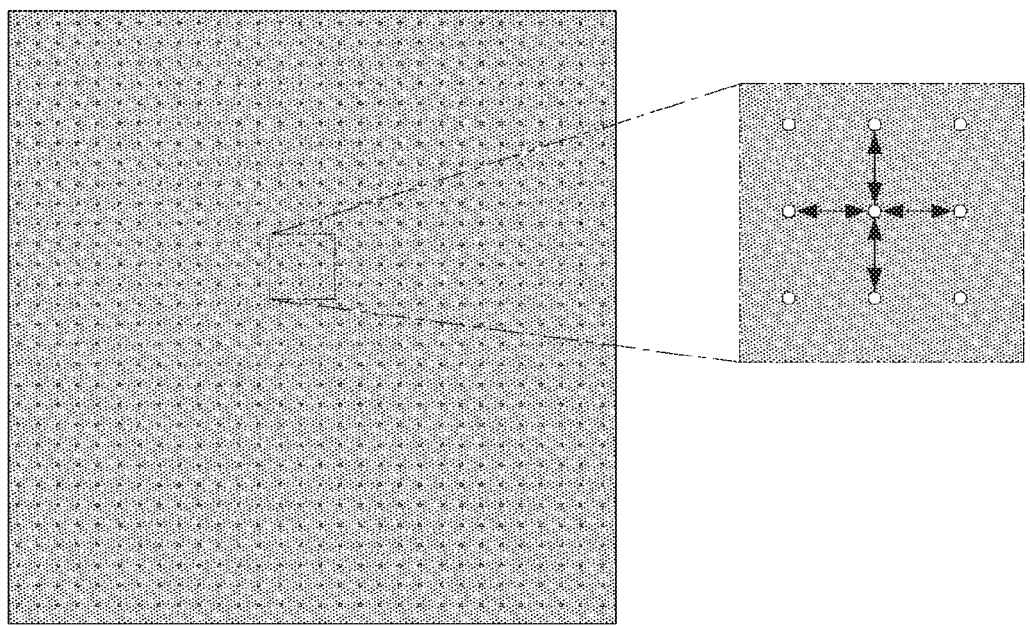
Figure 4C:
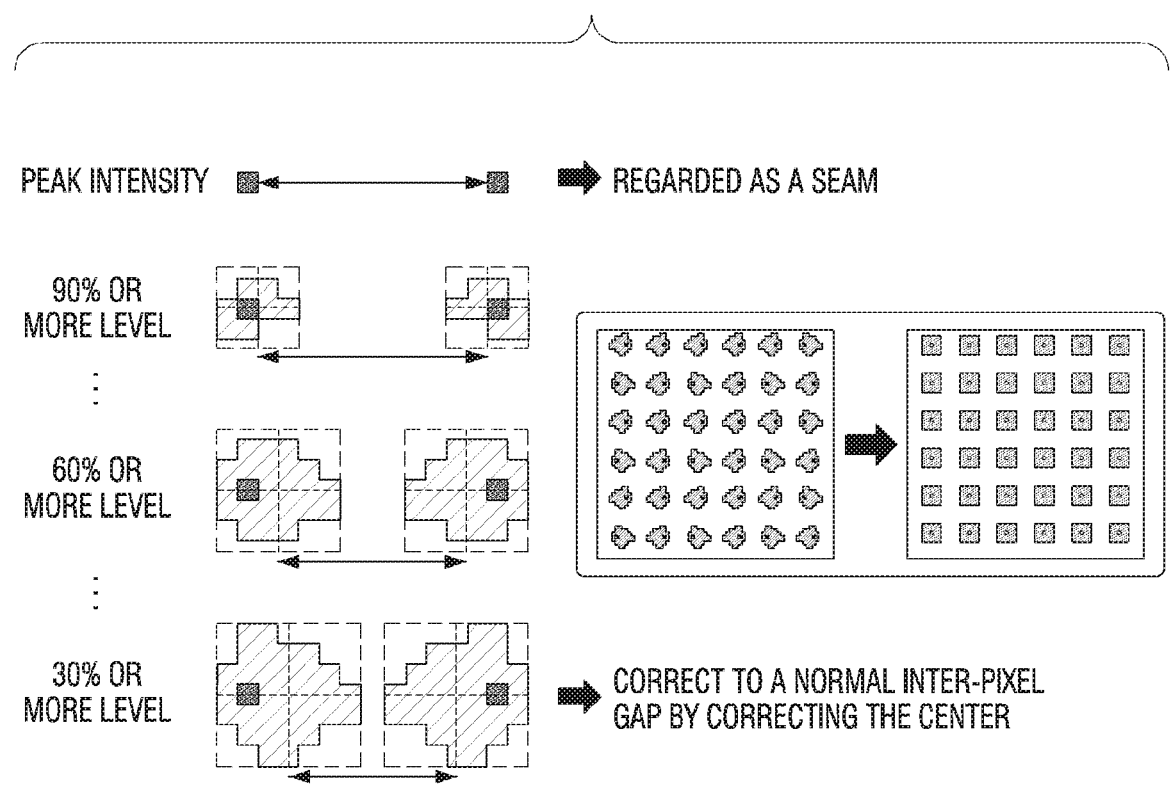

Specifically, the processor 230 may derive, from the measurement data as shown in FIG. 4A, a peak intensity of each pixel region, as shown in FIG. 4B. Further, the processor 230 may determine a pixel estimated region by determining an area around the peak intensity locations with luminance above a luminance level as shown in FIG. 4C. In this case, the processor 230 may determine pixel estimated region to the extent that the extended pixel estimated regions do not overlap each other and are extended to be consistent with the pixel size stored in the storage 220. The processor 130 may thereby determine a final estimated pixel region. The inter-pixel gap may be derived based on the final estimated pixel region. Accordingly, as the center is corrected based on the extended region, the inter-pixel gap may be corrected to a normal inter-pixel gap.

Figure 4D:
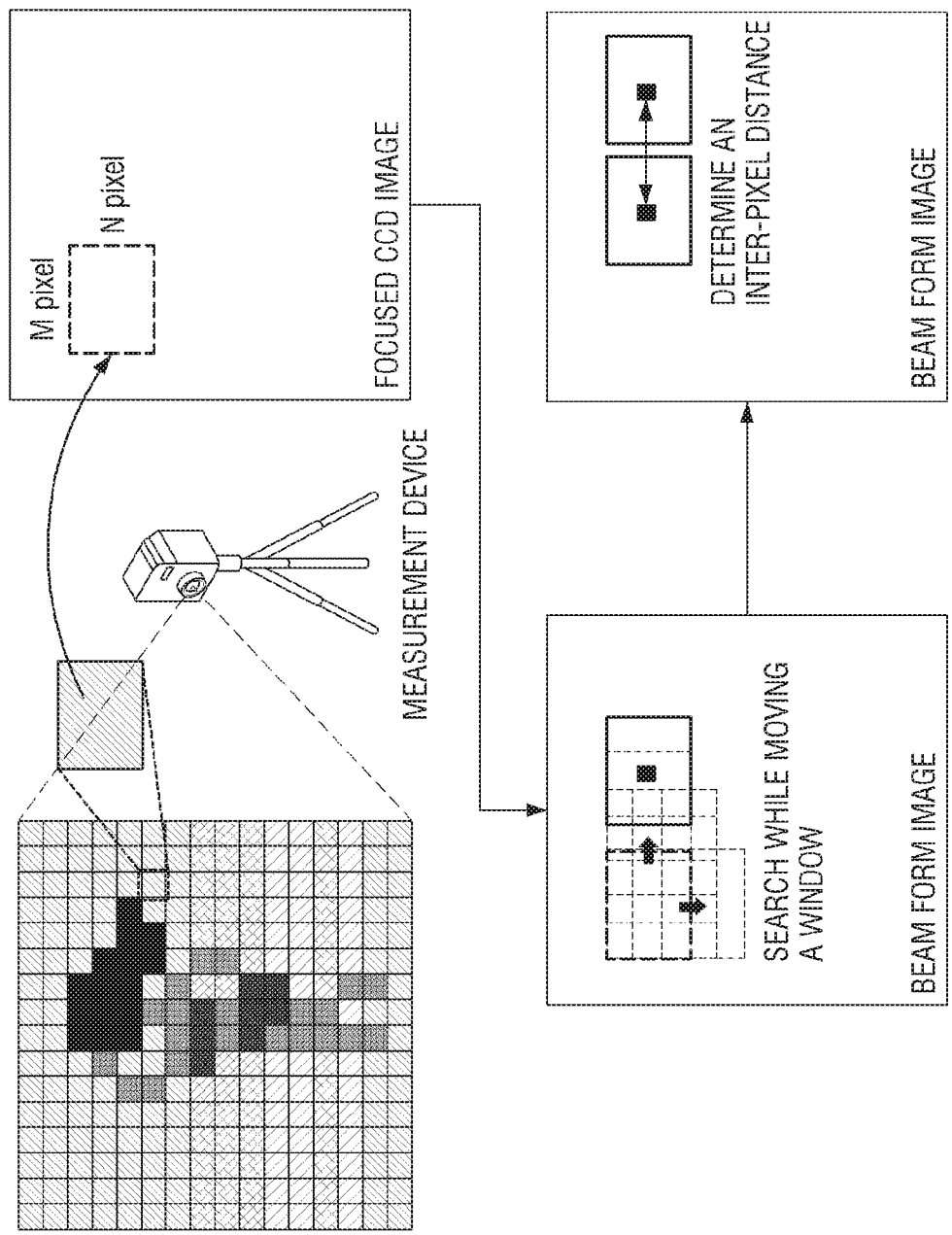

However, this should not be considered as limiting. The inter-pixel gap may be derived using other methods. For example, a physical size, rather than a light emission form, of a display pixel may be exactly measured by adjusting a focal point of a measurement device before a beam form is measured. Thus, as shown in FIG. 4D, a charge-coupled device (CCD) image size M×N corresponding to one pixel may be derived. Next, a window M×N having the same size as the CCD size corresponding to one pixel is defined. Then, while moving the defined window up or down and to the left or right in the measurement image, from which the beam form is measured, along scan lines, a location having the maximum average intensity in the window is found in a predetermined region defined by the user. Then, the center of the window is determined as the center of the pixel. A distance between the centers of the adjacent pixels is determined as the inter-pixel gap.

Next, the processor 230 may detect the seam region by comparing the derived inter-pixel gap and a reference inter-pixel gap which is obtained from the storage 220. In response to the derived inter-pixel gap being greater than the reference inter-pixel gap by a predetermined threshold, the corresponding region may be determined as a seam region, which may result in a dark line being visible. For convenience of explanation, the region in which the dark line is visible is the seam region, but, in response to the derived inter-pixel gap being smaller than the predetermined threshold, the seam region may result in an emission line being visible.

Information on the seam region detected as described above, for example, information on the location and size of the seam region, may be stored in the storage 220.

However, the above-described seam region detecting method is merely an example and the seam region may be detected in other methods.

Calculating Second Luminance Correction Coefficients (or Compensating for First Luminance Correction Coefficients)

The processor 130 may obtain information on the seam region and a luminance correction coefficient of at least one target pixel adjacent to the seam region from the storage 220, and may calculate the second luminance correction coefficient for the target pixel based on a compensation value for compensating for the seam region. Or, based on the compensated grayscale value for compensating for the seam region, compensate for the first luminance correction coefficient and obtain the second luminance correction coefficient.

Specifically, the processor 230 may calculate the second luminance correction coefficient by adjusting the maximum luminance value of the target pixel region to have a luminance value corresponding to the compensation grayscale value which should be provided in the target pixel region to remove display abnormalities caused by the seam region. For example, the processor 130 may calculate the second luminance correction coefficient by increasing the maximum luminance value of the target pixel region to have the luminance value corresponding to the compensation grayscale value which should be provided in the target pixel region to remove the dark line.

According to an exemplary embodiment, the processor 230 may determine all of the plurality of pixels adjacent to the seam region as the target pixels for luminance compensation.

Figure 11:
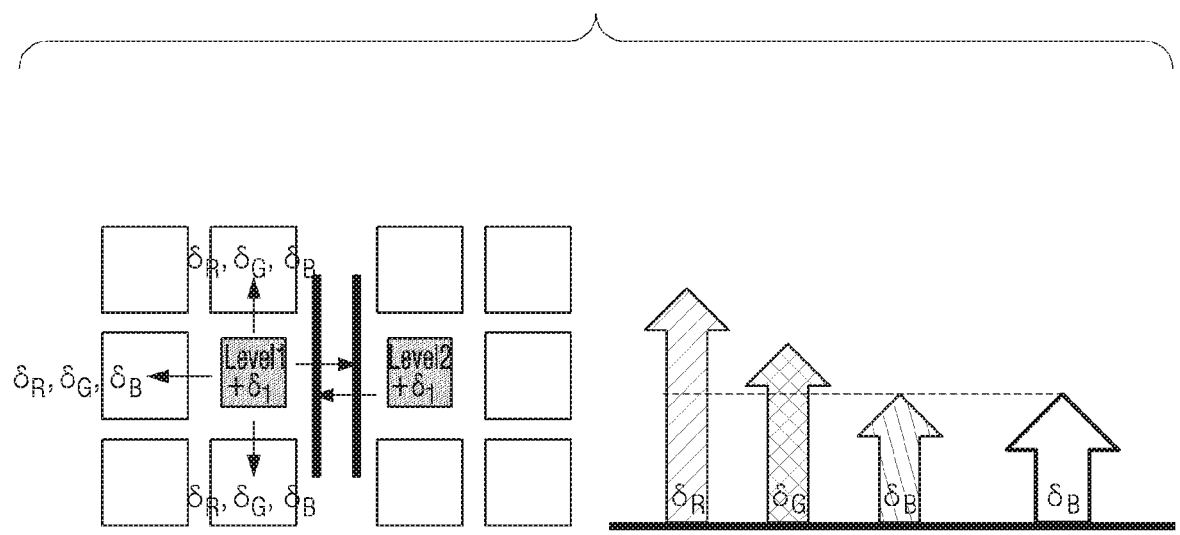
FIG. 11, FIG. 12, and FIGS. 13A and 13B are views to illustrate a method for determining a target pixel according to another exemplary embodiment.

However, according to another exemplary embodiment, at least one pixel region spaced by a predetermined gap from among the plurality of pixel regions adjacent to the seam region may be determined as the target pixel region. This is because, when the luminance of all of the pixels adjacent to the seam region is increased, red, blue and green intensities overlap one another, as shown in FIG. 11, and white increases, causing an emission line.

Accordingly, the processor 230 may set pixels which are spaced by a predetermined pixel gap from among the plurality of pixels located on one side or both sides of the seam region as the target pixels. For example, when only the pixels located on one side of the seam region in the horizontal direction, that is, on the left side or right side, are corrected, pixels spaced by a predetermined pixel gap from among the pixels located on the left or right side may be set as the target pixels. In addition, when only the pixels located on one side of the seam region in the vertical direction, that is, on the upper side or lower side, are corrected, pixels spaced by a predetermined pixel gap from among the pixels located on the upper side or lower side may be set as the target pixels.

In addition, when all of the pixels adjacent to both sides of the seam region are corrected, the processor 230 may set pixels located in a zig-zag pattern as the target pixels.

Specifically, from among a plurality of first pixels included in a pixel region adjacent to one side of the seam region and from among a plurality of second pixels included in a pixel region adjacent to the other side of the seam region, a plurality of first pixels and a plurality of second pixels located in the zig-zag pattern may be determined as the target pixels.

According to an exemplary embodiment, the processor 230 may model distribution of luminance intensities on the plurality of pixel regions adjacent to both sides of the seam region, calculate a compensation grayscale value based on the modeled luminance intensity distribution, and estimate a luminance intensity corresponding to the calculated compensation grayscale value. Next, the processor 230 may calculate the second luminance correction efficient corresponding to the target pixel based on the calculated luminance value.

In particular, in response to the compensation grayscale value exceeding a maximum grayscale value, for example, a 255-grayscale value, the processor 230 may estimate a luminance value corresponding to the corresponding compensation grayscale value and calculate the second luminance correction coefficient such that the target pixel region has the estimated luminance value.

To explain the process of calculating the second luminance correction coefficient of the target pixel, an 8-bit input image is assumed. First, the reason why the separate second luminance correction coefficient of the target pixel, that is, why the first luminance correction coefficient of the target pixel is compensated for is that it is impossible to correct an image having a maximum grayscale value, that is, an image of a 255-grayscale, to have a higher grayscale when the seam region is compensated for through the grayscale of the input image. That is, when the input image has the 255 grayscale, the input image should be corrected to have a higher grayscale to compensate for the seam region. However, because the 255 grayscale is the highest grayscale, it is impossible to correct the grayscale to be higher. Accordingly, in one exemplary embodiment, the reduced luminance of the pixel may be corrected for the sake of uniformity between the pixels as described above.

For example, when the original luminance value of the target pixel region is 1000 nits (candela per square meter), the compensation grayscale value for removing the seam region is a 265 grayscale, and the corresponding luminance value is 1039 nits, the processor 230 may calculate the second luminance correction coefficient of the target pixel region, such that the original luminance value changes from 1000 nits to 1039 nits. That is, the second luminance correction coefficient of the target pixel region may be calculated for compensating for the seam region separately from the first luminance correction coefficient for uniformity.

Unlike in the above-described exemplary embodiment in which the dark line is visible because the assembly tolerance between the display modules is greater than an average distance between the pixels, when the assembly tolerance between the display modules is smaller than the average distance between the pixels, an emission line may be visible. However, when the input image has a 1 grayscale, there is a problem that the grayscale cannot be corrected to be darker. In this case, the luminance of the pixel may be compensated for using a similar principle. However, in the following description, the case in which the seam region is visible as the dark line will be described for convenience of explanation.

Figure 5A:
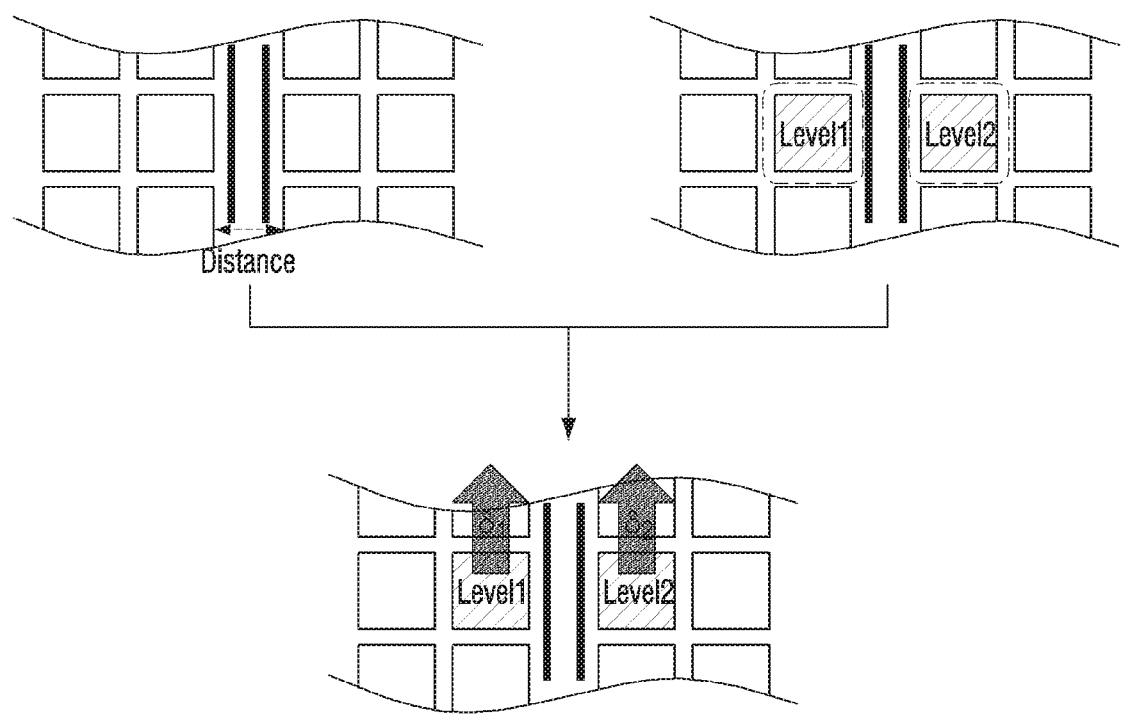

Meanwhile, the processor 230 may estimate a maximum luminance value of the seam region based on an inter-pixel gap of the seam region and a maximum luminance value of pixels adjacent to the seam region as shown in FIG. 5A. The processor 230 may estimate the maximum luminance value of the seam region by conducting beam form modeling on luminance distribution with reference to a maximum grayscale level (for example, full white of the 255 grayscale). For example, the processor 130 may derive luminance distribution in the form of the Gaussian function corresponding to the pixel regions through beam form modeling on the pixel regions adjacent to both side of the seam region, and estimate a luminance value at the intersection point of the Gaussian functions as the maximum luminance value of the seam region.

Figure 5B:
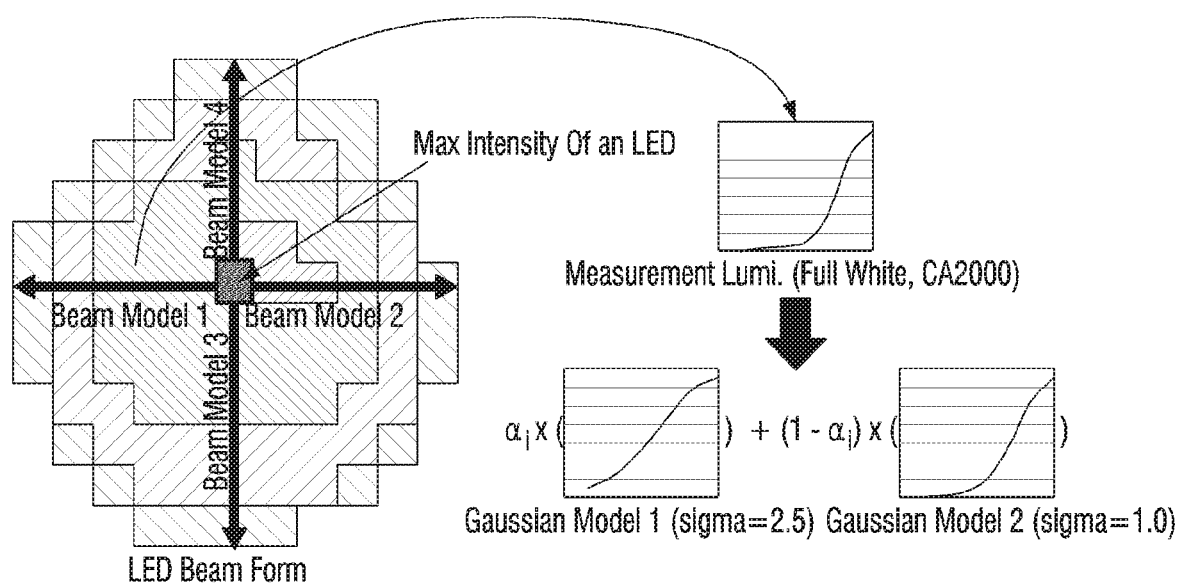

Specifically, the processor 230 may derive a luminance distribution function in the form of the Gaussian function by conducting beam forming modeling based on the inter-pixel gap of the seam region and the maximum luminance value of the target pixel adjacent to the seam region as shown in FIG. 5B.

Next, the processor 230 may compare a first luminance value at the intersection point of the Gaussian functions corresponding to the target pixel regions adjacent to both sides of the seam region, and a second luminance value at the intersection point of the Gaussian functions corresponding to the other pixel regions, that is, the pixel regions not having the seam region.

In this case, the processor 230 may calculate a grayscale value for removing the seam region by adjusting upward the Gaussian function to make the second luminance value equal to the first luminance value. That is, the processor 230 may calculate a compensation grayscale value corresponding to the maximum value of the Gaussian function adjusted upward and then calculate a maximum luminance value corresponding to the compensation grayscale value. That is, because the maximum value of the Gaussian function indicates the 255 grayscale, the processor 230 may calculate the grayscale value indicated by the maximum value of the Gaussian function adjusted upward, and the corresponding grayscale value may be the compensation grayscale value. Next, the processor 230 may calculate a luminance value corresponding to the compensation grayscale value. That is, when the maximum luminance value of the Gaussian function is 1000 nits, an inter-grayscale luminance gap may be derived based on 1000 nits/255, and the luminance value corresponding to the compensation grayscale value may be calculated.

Figure 6B:
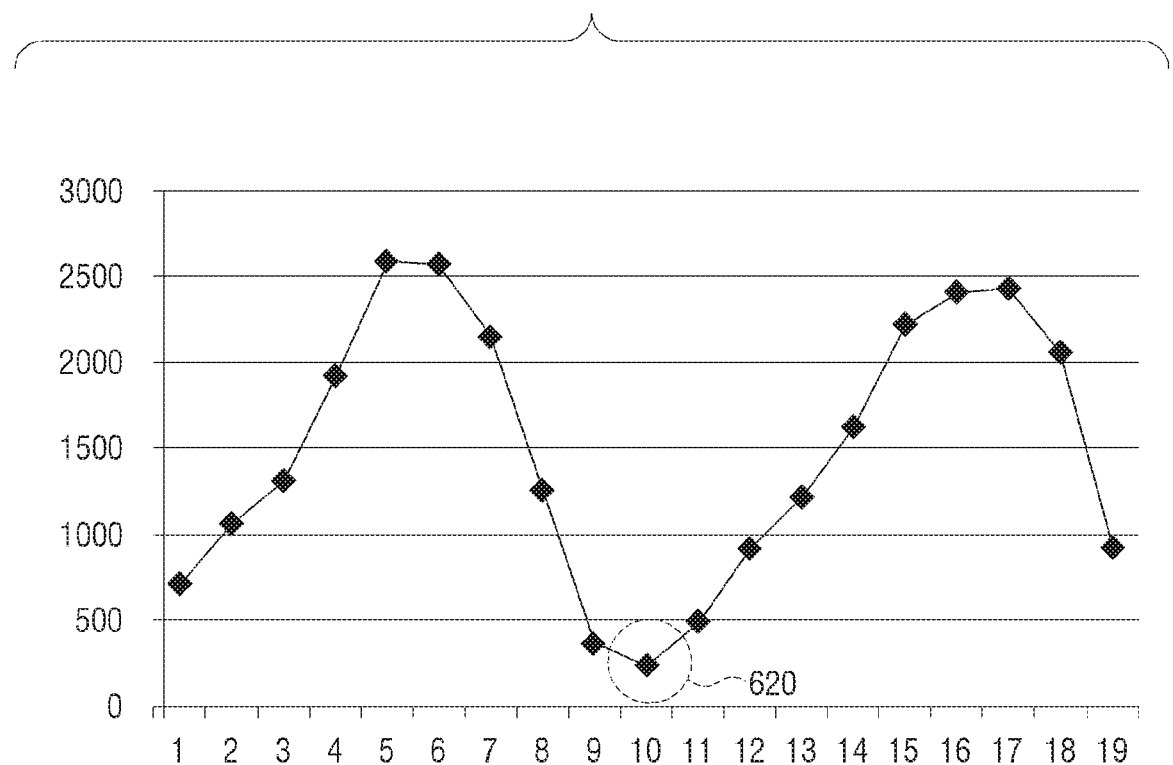
Figure 6C:
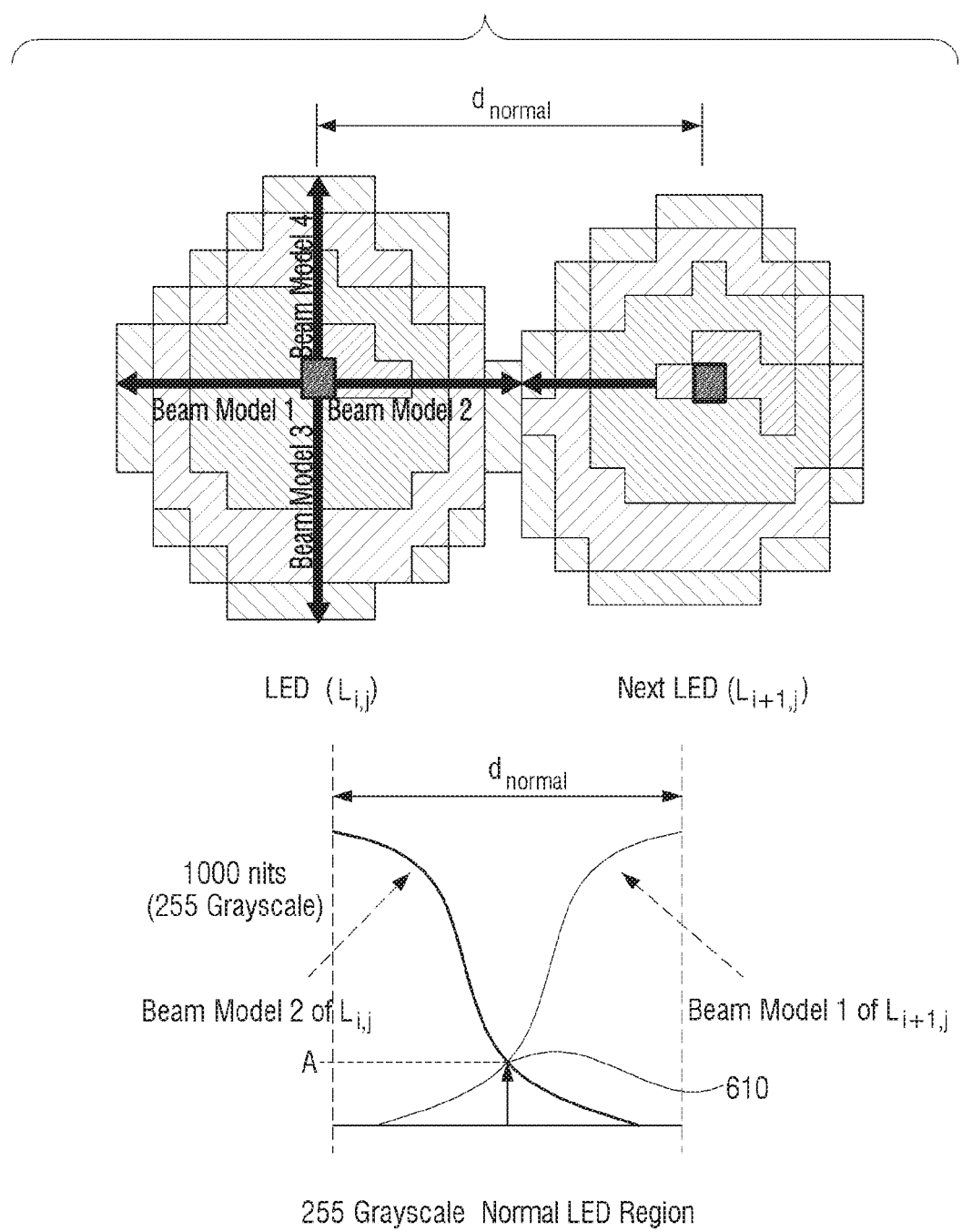
Figure 6D:
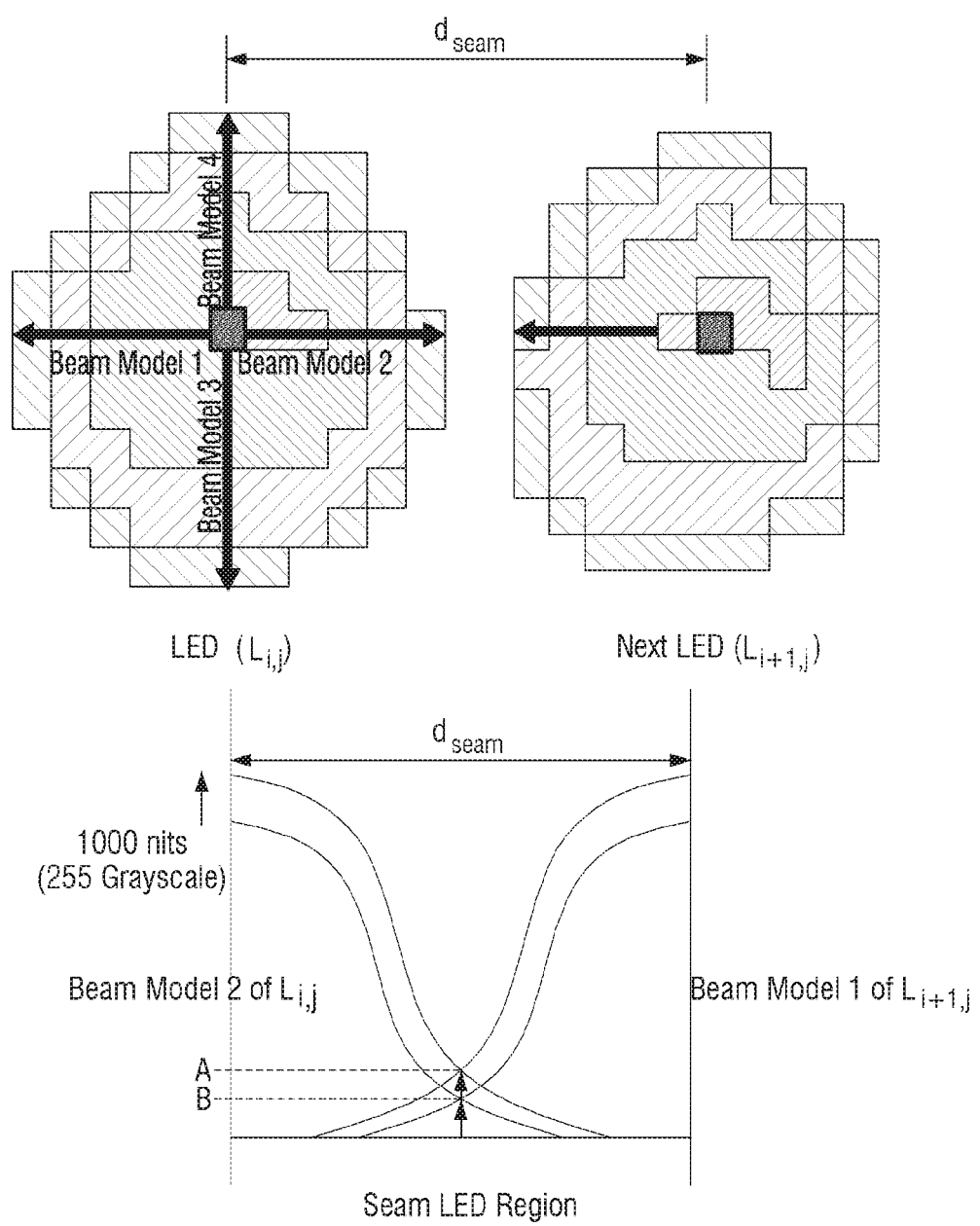

For example, FIG. 6A, which illustrates experimental data, and FIG. 6C, which illustrates schematized data, indicate an interference luminance value (FIG. 6A 610) at the intersection point of the Gaussian functions of adjacent pixels when the pixels have a normal pixel gap (dnormal), and FIG. 6B (experimental data) and FIG. 6D (schematized data) indicate an interference luminance value (FIG. 6B 620) at the intersection point of the Gaussian functions of adjacent pixels when the pixels have a pixel gap (dseam) causing a seam. In this case, to remove display abnormalities caused by the seam, the interference luminance value (B) of the seam region illustrated in FIG. 6D should be corrected to the interference luminance value (A) of the seam region shown in FIG. 6C. Accordingly, the processor 230 may adjust upward the Gaussian function of each of the target pixel regions such that the interference luminance value (B) of the seam region as shown in FIG. 6D becomes the interference luminance value (A) of the case in which the pixels have the normal pixel gap (dnormal) as shown in FIG. 6C. Thereafter, the processor 130 may calculate a grayscale value indicated by the vertex of the Gaussian function of each of the target pixel regions adjusted upward. That is, because the maximum grayscale value indicated by the vertex of the Gaussian function before being adjusted is 255, the maximum grayscale value indicated by the vertex of the Gaussian function after being adjusted upward, that is, the compensation grayscale value, may be calculated, and the maximum luminance value corresponding to the compensation grayscale value may be calculated.

Thereafter, the processor 230 may estimate the second luminance correction coefficient of each of the target pixel regions, such that each of the target pixel regions has the vertex of the Gaussian function adjusted upward, that is, the maximum luminance value.

For example, self-light emitting pixels 710-1 to 710-12 (for example, LED pixels), constituting the display as shown in FIG. 7, may have respective different luminance values. In this case, the first luminance correction coefficients 720-1 to 720-12 may be pre-calculated for pixel regions in order for the self-light emitting pixels to have a specific reference luminance value, for example, 1000 nits. This specific target luminance value is achieved through calibration for the sake of uniformity between the pixels, and may be stored in the storage 220.

In response to the different first luminance correction coefficients 720-1 to 720-12 being applied to the pixels as described above, the pixels may have the same maximum luminance value (for example, 1000 nits), and, as shown in FIG. 8, the pixels may have the same luminance value according to an image grayscale.

Figure 8B:
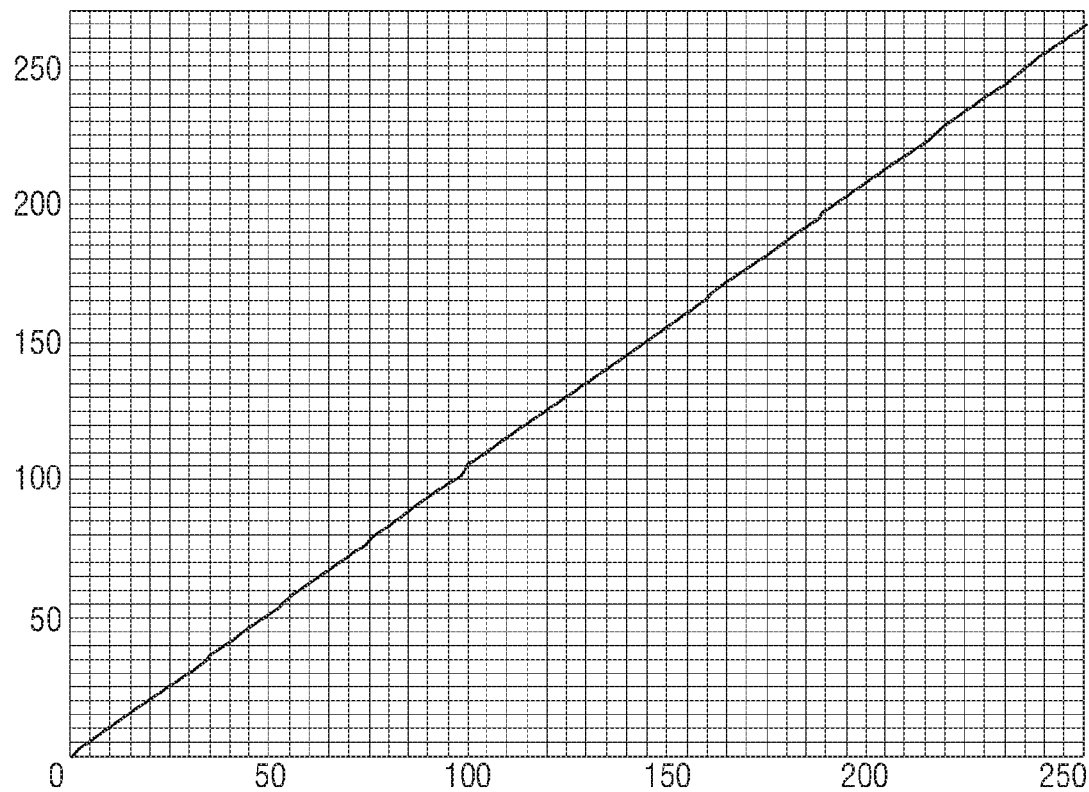

However, in this case, referring to a graph indicating a compensation grayscale against an input grayscale to be compensated to remove display abnormalities caused by the seam region, which is calculated through beam form modeling, as shown in FIG. 8B, because the compensation grayscale value for removing the seam exceeds 256 over the 246 grayscale, it is impossible to compensate for the grayscale. According to the graph, in response to the input grayscale being 255, the compensation grayscale is 265.

Figure 9A:

When the grayscale to be displayed on adjacent pixels 710-2, 710-3, 710-6, 710-7, 710-10, 710-11 is 265, to remove display abnormalities caused by the seam region, the processor 230 may compensate for the luminance of the pixels, such that the pixels adjacent to the seam region have 1039 nits which is luminance required by the compensation grayscale 265, as shown in FIG. 9A.

Figure 9B:
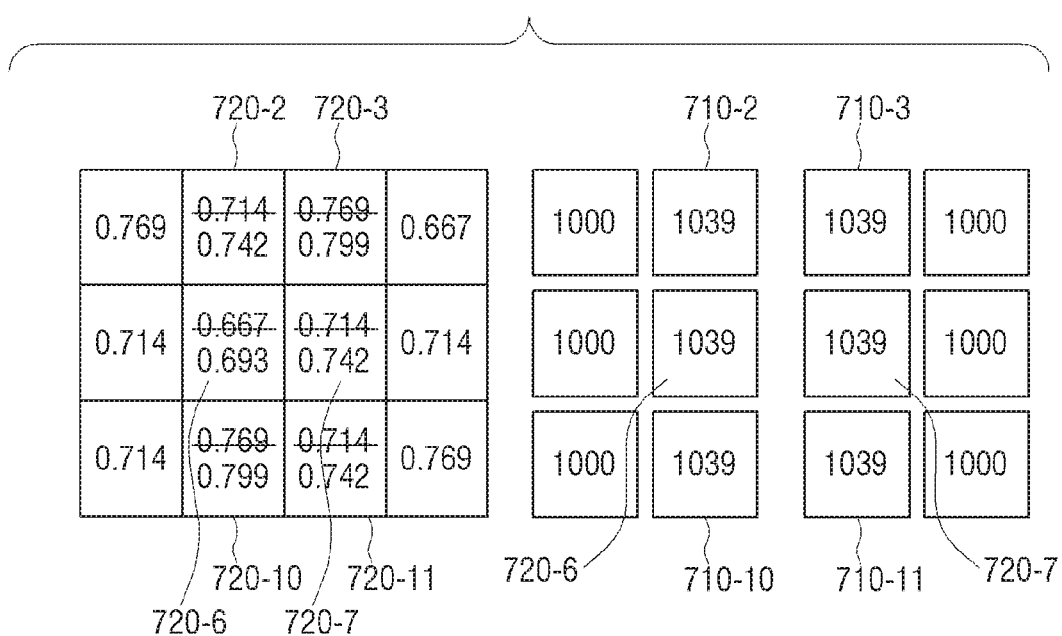

Specifically, as shown in FIG. 9B, in order for the pixels 710-2, 710-3, 710-6, 710-7, 710-10, and 710-11 adjacent to the seam region, the original luminance values of which are 1400, 1300, 1500, 1400, 1300, and 1400, to have the luminance value of 1039 nits, the respective luminance correction coefficients should be corrected to 0.742, 0.799, 0.693, 0.742, 0.799, 0.742 (720-2, 720-3, 720-6, 720-7, 720-10, 720-11). Accordingly, the processor 230 may separately estimate the second luminance correction factor to the pixels 710-2, 710-3, 710-6, 710-7, 710-10, 710-11 adjacent to the seam region and store in the storage 220.

Meanwhile, the processor 230 may update the first luminance correction coefficients of the target pixels stored in the storage 220 with the second luminance correction coefficients. However, this is not limiting and the processor 130 may store the second luminance correction coefficients in a separate memory and manage without updating the first luminance correction coefficients. Then, the first and second luminance correction coefficients may be transferred to the display apparatus 100 and stored in the storage 120 provided on the display apparatus.

According to another exemplary embodiment, the compensation grayscale value for compensating for the seam region which is estimated by the above method may be stored in the storage 120 provided in the display apparatus 100 in the form of a lookup table.

Alternatively, the compensation grayscale value for compensating for the seam region may be obtained experimentally and stored in the storage 120 provided in the display apparatus 100. For example, in a state in which a predetermined sample image (for example, a full white image) is displayed on the display 110, the image may be displayed while changing the grayscale of the image displayed on at least one target pixel region adjacent to the seam region, and a grayscale of an image from which the seam region is compensated for may be determined and stored in the storage 120 in the form of a lookup table. In this case, the processor 130 provided on the display apparatus 100 may correct the first luminance correction coefficients to have the corresponding luminance values based on the compensation grayscale values obtained from the storage 120 or estimate the second luminance correction coefficient and apply the same to the target pixel region.

Compensating for a Grayscale of an Input Image

Hereinafter, a method for compensating for grayscale of an input image of the display apparatus 100 will be described.

First, the processor 130 of the display apparatus 100 may drive the display 110 by applying the second luminance correction coefficient to the target pixel adjacent to the seam region and apply the first luminance correction coefficient to the remaining pixel. That is, the processor 120 may obtain the first and second luminance correction coefficients from the storage 120 and apply the same.

When the luminance of the pixel is compensated for through the luminance correction coefficient to compensate for the luminance corresponding to the maximum grayscale as described above, there is a problem that the luminance value is higher than required when an image of a grayscale other than the maximum grayscale is displayed. This is because, as the maximum value of the Gaussian function graph described above, that is, the luminance value corresponding to the maximum grayscale, is adjusted upward, an inter-grayscale luminance gap also increases.

Accordingly, the processor 130 may apply the second luminance correction coefficient obtained from the storage 120 to the target pixel region and then compare a luminance value of each grayscale of an input image according to the second luminance correction coefficient and a luminance value of each grayscale of an input image according to the first luminance correction coefficient obtained from the storage 120, and may correct the grayscale value of the input image and render the image to be displayed.

Specifically, when an image less than or equal to a predetermined grayscale value (for example, 254) is displayed on the target pixel region, the processor 130 may correct the grayscale value of the input image corresponding to the target pixel, such that the luminance value adjusted upward according to the second luminance correction coefficient is adjusted downward based on the grayscale value of the image displayed on the target pixel, and may render the image to be displayed.

For example, as shown in FIG. 10, it is assumed that the grayscale of an input image is 128 (corresponding luminance is 501.76 nits) before the luminance of the pixel is compensated, and the seam region is compensated for by correcting the grayscale of an image displayed on the seam region to 132 (corresponding luminance is 516.78 nits). In this case, in response to the luminance of the pixel being compensated according to an exemplary embodiment, the image of the grayscale of 128 has a luminance value of 520.96 nits, which is higher than 516.78 nits which is the luminance value corresponding to the compensation grayscale. Accordingly, the grayscale of the image displayed on the seam region should be adjusted downward from 128 to 127 (luminance value is 516.89 nits), which has a similar luminance value to 516.78 nits.

According to another exemplary embodiment, when at least one pixel region spaced by a predetermined gap is determined as the target pixel region from among the plurality of pixel regions adjacent to the seam region on the display 110, the intensity of the seam region may be reduced and display abnormalities caused by the seam region may not be completely removed. Accordingly, the processor 130 may additionally adjust upward the luminance value of the target pixel region to compensate for the reduced intensity.

Figure 12:
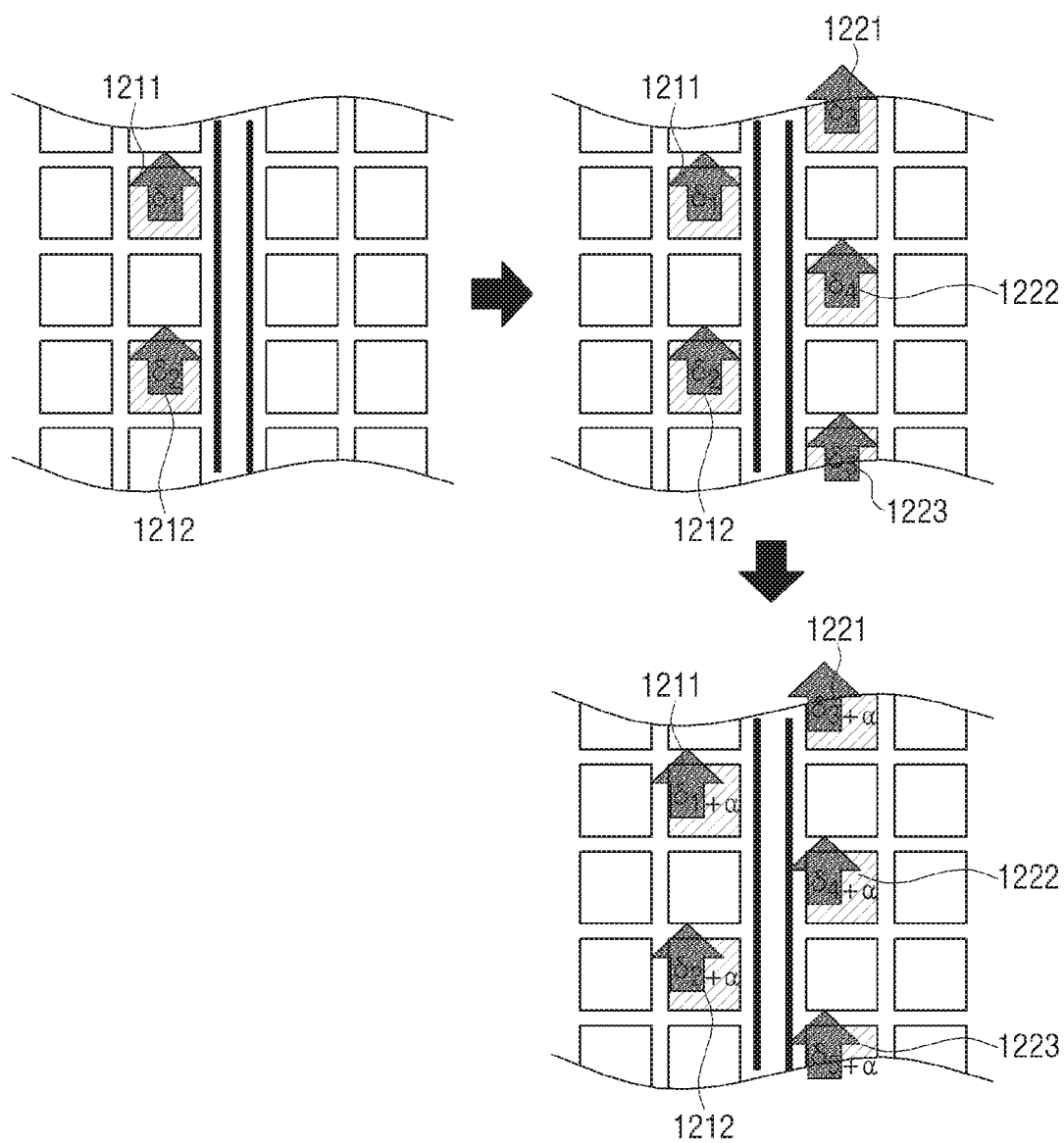

For example, when pixels 1211, 1212, 1221, 1222 and 1223, located on the left and right sides of the seam region in a zig-zag pattern, are set as target pixels and luminance values are compensated as shown in FIG. 12, the intensity of the seam region may be compensated upward by adjusting upward the grayscales of images displayed on the target pixels. The zig-zag compensation can reduce the appearance of an emission line in comparison to the compensation of all adjacent pixels, but the luminance value increased due to the zig-zag compensation may be passed to neighbor pixels and the luminance of the neighbor pixels increases. That is, when a luminance value increased by compensating for a luminance correction coefficient at a specific target pixel is ΔI, the luminance of pixels adjacent to the specific target pixel is proportional to the square of a distance (r), and thus is adjusted upward as much as ΔI/r2. Accordingly, a problem that an emission line is visible due to the removal of a dark link can be prevented by adjusting downward the luminance value of the corresponding neighbor pixels.

Figure 13A:
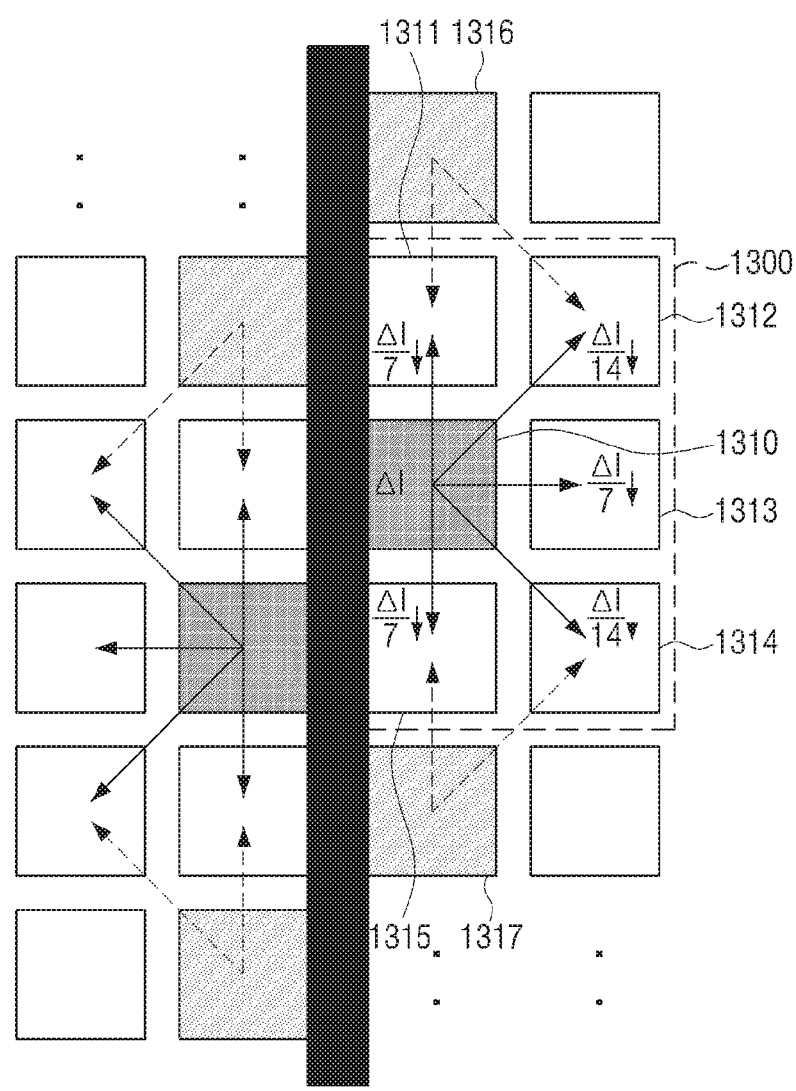

For example, as shown in FIG. 13A, an increased luminance value of a specific target pixel 1310 adjacent to a seam region of a vertical direction is passed to pixels 1311 to 1315 included in a neighbor pixel region 1300 of the target pixel 1310 in inverse proportion to a distance. When it is assumed that the luminance passed from the target pixel 1310 to the upper side/lower side/right side by the same distance (l) is A, the luminance passed to the neighbor pixels 1311, 1313, and 1315 is A, and the luminance passed to the neighbor pixels 1312 and 1314 is A/2 because the neighbor pixels 1312 and 1314 are further away than the neighbor pixels 1311, 1313, and 1315 by √2. In addition, other target pixels 1316 and 1317 may affect the neighbor pixel region 1300 of the target pixel 1310 in addition the corresponding target pixel 1310 as shown in FIG. 10. The total amount of luminance passed to the neighbor pixels is calculated as 7A. As a result, because 7A=ΔI, A=ΔI/7 and thus the luminance is passed to the neighbor pixels 1311, 1313, and 1315 by ΔI/7 and is passed to the neighbor pixels 1312 and 1314 by ΔI/14. Accordingly, an additional emission line can be prevented from being visible due to the removal of a dark line by adjusting downward the luminance correction coefficients of the neighbor pixels of the target pixel by ΔI/7 or ΔI/14.

Figure 13B:
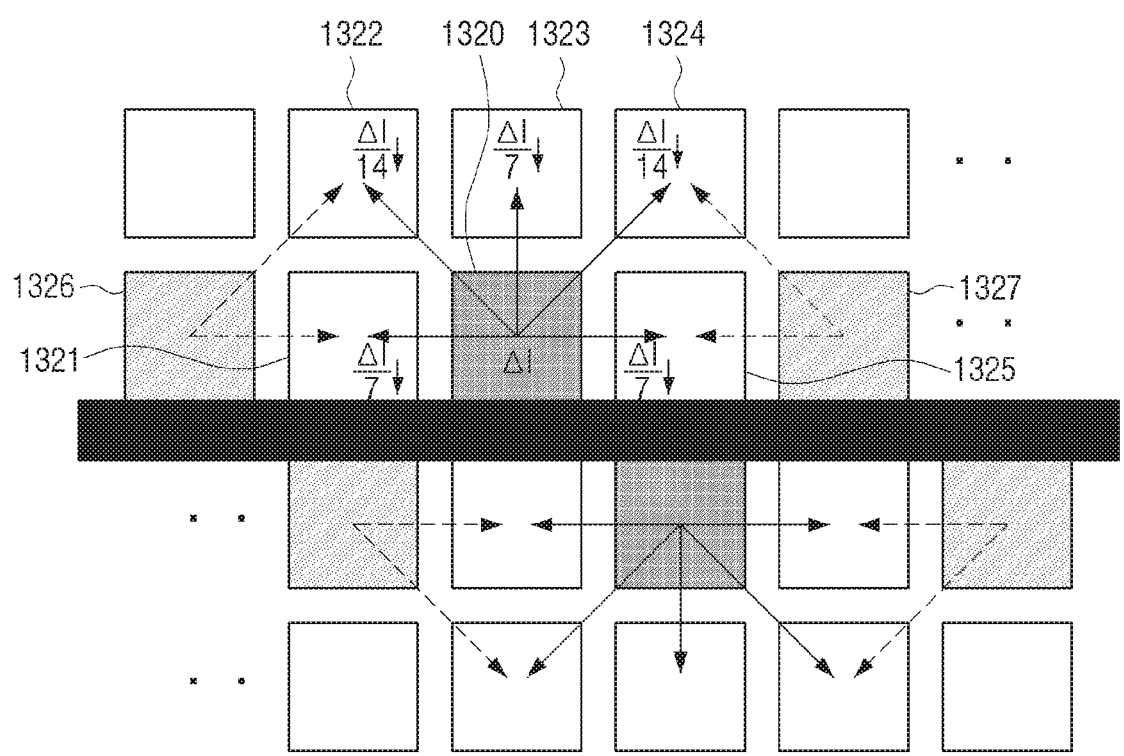

FIG. 13B illustrates an influence by an increased luminance value of a specific target pixel 1320 of a seam region in a horizontal direction, and has a similar principle to that discussed above with reference to FIG. 13A, and thus a detailed description is omitted.

Figure 14:
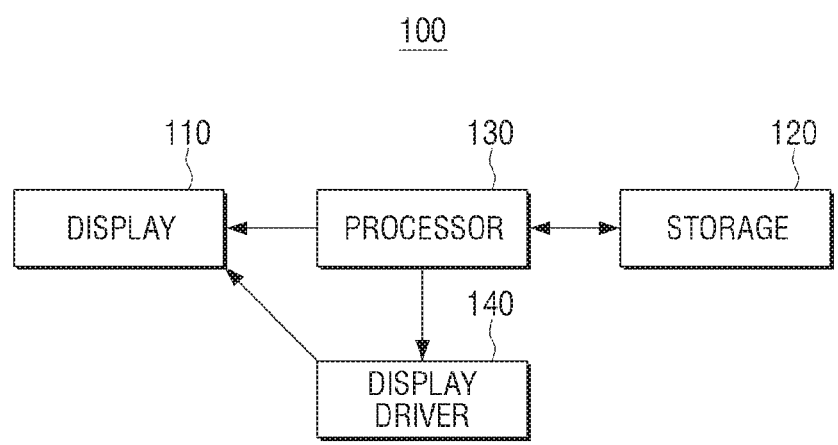
FIG. 14 is a block diagram to illustrate detailed operations of a display apparatus according to an exemplary embodiment.

FIG. 14 is a block diagram to illustrate detailed operations of a display apparatus according to an exemplary embodiment.

Referring to FIG. 14, the display apparatus 100 includes a display 110, a storage 120, a processor 130, and a display driver 140. Elements discussed above with reference to FIG. 2 will not be described again in detail.

The processor 130 may include a CPU, a Read Only Memory (ROM) (or a non-volatile memory) in which a control program for controlling the display apparatus 100 is stored, and a Random Access Memory (RAM) (or a volatile memory) which stores data inputted from the outside of the display apparatus 100 or is used as a storage region corresponding to various jobs performed in the display apparatus 100. The CPU may access the storage 120 and perform booting using an operating system (O/S) stored in the storage 120. In addition, the CPU may perform various operations using various programs, contents, and data stored in the storage 120.

The display driver 140 drives the display 110 under the control of the processor 130. For example, the display driver 140 may apply a driving voltage or a driving current for driving each of the self-light emitting elements constituting the display panel 110, for example, the LED pixels, under the control of the processor 130, thereby driving each of the LED pixels.

In response to a luminance correction coefficient being corrected, the processor 130 may adjust a duty ratio of pulses (R_Pulse, G_Pulse, and B_pulse) inputted to at least one LED pixel corresponding to a corresponding target pixel region to drive the target pixel region according to the corrected luminance correction coefficient. To achieve this, the processor 130 may adjust the duty ratio of the pulses (R_Pulse, G_Pulse, and B_pulse) according to the corrected luminance correction coefficient and output the duty ratio to the display driver 140 for driving the LED pixels. The display driver 140 supplies a driving current to the display 110 to correspond to each of the control signals inputted from the processor 140, and drives the display 110. That is, the display 110 may adjust supply time or intensity of the driving current supplied to each LED element to correspond to each driving signal, and output the driving current.

In this case, the display driver 140 may include a plurality of driving modules corresponding to the plurality of display modules, or may be implemented by using a single driving module for driving all of the plurality of display modules. For example, the plurality of driving modules corresponding to the plurality of display modules may be formed as a plurality of semiconductor integrated circuits (ICs).

According to an exemplary embodiment, each of the plurality of display modules may include a driving module for driving a corresponding display module, and a sub processor for controlling the operation of the corresponding display module under control of the sub processor. In this case, each of the sub processors and each of the driving modules may be implemented by using hardware, software, firmware, an integrated circuit (IC), or the like. According to an exemplary embodiment, each of the sub processors may be implemented by using a separate semiconductor IC.

Figure 15:
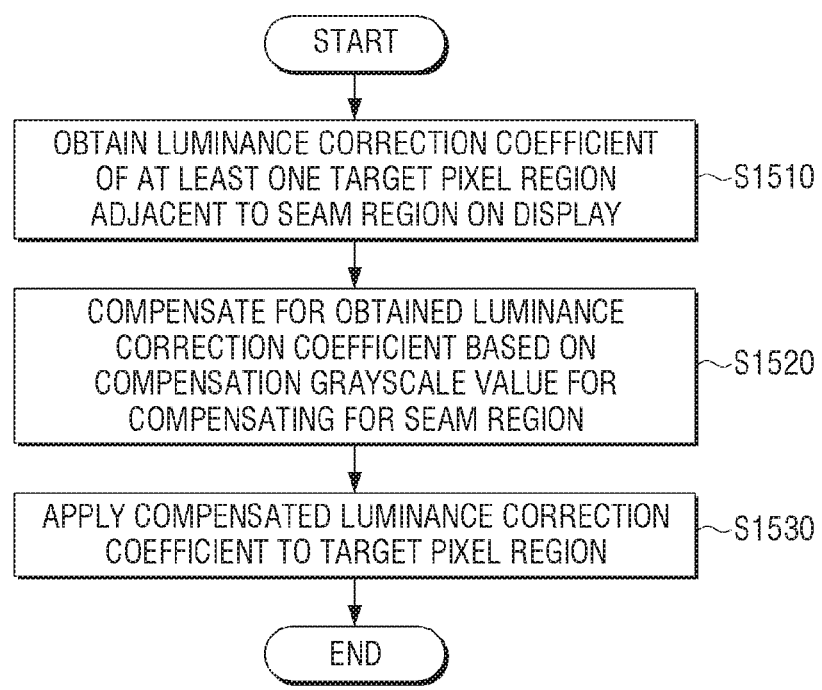
FIG. 15 is a flowchart to illustrate a control method of a display apparatus according to an exemplary embodiment.

FIG. 15 is a flowchart to illustrate a control method of a display apparatus according to an exemplary embodiment.

A display apparatus performing the control method shown in FIG. 15 may include a display 110 with a plurality of display modules, and a storage 120 for storing the first luminance correction coefficients corresponding to light emitting pixels constituting each of the plurality of display modules and the second luminance correction coefficients corresponding to at least one target pixels adjacent to the seam region from among light emitting pixels. Herein, each display module may be implemented by using an LED module including at least one LED element or an LED cabinet in which a plurality of LED modules are connected to one another.

First, the second luminance correction coefficient of at least one target pixel region adjacent to a seam region on the display 110 and the first luminance correction coefficient for remaining pixels are obtained from the storage (S1510). Here, the first luminance correction coefficient may be calibrated for uniformity among the light-emitting pixels constituting each of the plurality of display module. Here, the second luminance correction coefficient may be calculated based on the target luminance value to compensate the seam region while the first luminance correction coefficient is applied to each of the light-emitting pixels.

Next, by applying the second luminance correction coefficient to the target pixel and applying the first luminance correction coefficient to the remaining pixel, the display is driven (S1520).

In this case, the target luminance value may correspond to a compensation grayscale value to compensate the seam region. The compensation grayscale value may be calculated by modeling a distribution of light intensity by each of a plurality of target pixels adjacent to the seam region.

The compensation grayscale value may model light intensity distribution corresponding to each of the plurality of target pixels adjacent to the seam region in a form of Gaussian function and may be calculated so that a luminance value at an intersection point of each of modeled Gaussian function is a predetermined luminance value.

The controlling method may include applying the second luminance correction coefficient to the target pixel, comparing the luminance value of each grayscale of an input image according to the second luminance correction coefficient and the luminance value of an input image according to the first luminance correction coefficient, and rendering an output image.

The controlling method may include, when a grayscale value of an image displayed on the target pixel is less than or equal to a predetermined grayscale value, correcting the grayscale value of the input image and rendering the output image. Here, the grayscale value of the input image may be corrected such that the luminance value adjusted according to the second luminance correction coefficient is adjusted upward or downward based on the grayscale value of the image displayed on the target pixel.

Figure 16:
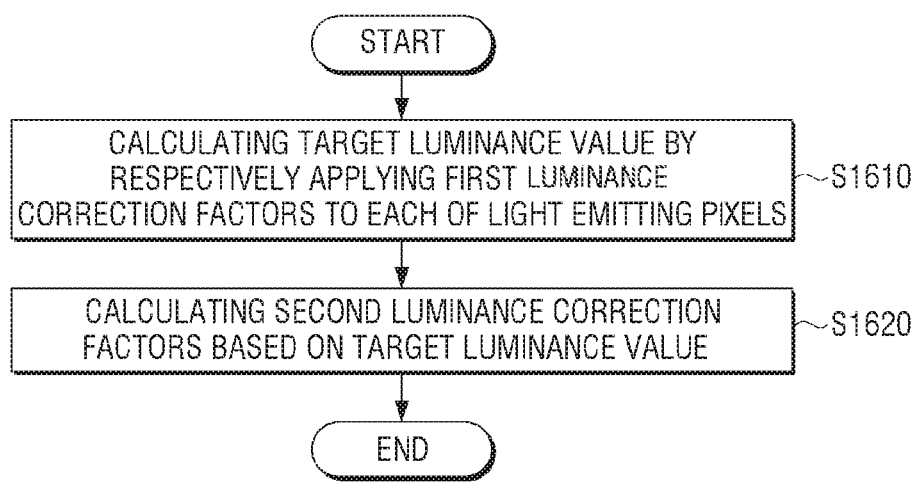
FIG. 16 is a flowchart to illustrate a control method of an electronic apparatus according to an exemplary embodiment.

FIG. 16 is a flowchart to illustrate a method for controlling an electronic apparatus according to an exemplary embodiment.

In case of the controlling method of an electronic apparatus as illustrated in FIG. 16, the electronic apparatus may store the first luminance correction coefficient corresponding to light emitting pixels constituting each of a plurality of display modules included in the display. Here, the first luminance correction coefficient may be calibrated for uniformity among the light-emitting pixels constituting each of the plurality of display modules, and this may be calculated by the electronic apparatus and stored. Also, it is possible that the first luminance correction coefficient may be calculated by another electronic apparatus and an external server and stored in the electronic apparatus.

According to the controlling method of an electronic apparatus as illustrated in FIG. 16, the target luminance value is calculated by respectively applying the first luminance correction factors to each of the light emitting pixels constituting each of a plurality of display modules (S1610). Here, the target luminance value may be a luminance value corresponding to the compensated grayscale value for compensating for the seam region.

Then, the second luminance correction coefficient corresponding to at least one target pixels adjacent to the seam region is calculated based on the target luminance value (S1620).

At S1620 to calculate the second luminance correction coefficient, the compensation grayscale value may be calculated by modeling a distribution of light intensity by each of a plurality of target pixels adjacent to the seam region.

The step of S1620 to calculate the second luminance correction coefficient may include modeling light intensity distribution corresponding to each of the plurality of target pixels adjacent to the seam region in a form of Gaussian function, and calculating the compensated grayscale value so that a luminance value at an intersection point of each of modeled Gaussian function is a predetermined luminance value.

The predetermined luminance value may be a luminance value at an intersection point of Gaussian function corresponding to each of a plurality of adjacent pixels without a seam region.

The controlling method may include the determining at least one pixel spaced by a predetermined gap from among the plurality of pixels adjacent to the seam region on the display as the target pixel. In this case, the determining the target pixel may include determining a plurality of first and second pixels arranged in a zig-zag pattern from among a plurality of first pixels included in a pixel region adjacent to one side of the seam region and a plurality of second pixels included in a pixel region adjacent to the other side of the ream region as the target pixels.

The method may include estimating luminance amount that increase in luminance according to the second luminance correction efficient of the target pixel is transferred to at least one adjacent pixels which are not selected as the target pixel; and adjusting the first luminance correction coefficient of the adjacent pixel based on the calculated luminance amount.

In addition, the electronic apparatus may further store information regarding size of pixels constituting each of a plurality of display modules and spaces among the pixels. In addition, the controlling method may further include calculating distance among the pixels based on the measurement data photographing the display, size of pixels, and space among pixels, and detecting the seam region based on the calculated distance among the pixels.

According to various exemplary embodiments described above, it is possible to remove display abnormalities caused by a seam region regarding input signals of all grayscale levels, thereby enhancing image quality to be provided to a user.

The methods according to various exemplary embodiments described above can be implemented by upgrading software/hardware of an existing unit display module and/or a display apparatus composed of unit display modules.

In addition, a non-transitory computer readable medium which stores a program for performing the control method according to exemplary embodiments in sequence may be provided.

The non-transitory computer readable medium refers to a medium that stores data semi-permanently rather than storing data for a very short time, such as a register, a cache, a memory or etc., and is readable by an apparatus. Specifically, the above-described various applications or programs may be stored in the non-transitory computer readable medium such as a compact disc (CD), a digital versatile disk (DVD), a hard disk, a Blu-ray disk, a universal serial bus (USB), a memory card, a ROM or etc., and may be provided.

The foregoing exemplary embodiments and advantages are merely exemplary and are not to be construed as limiting. The present teaching can be readily applied to other types of apparatuses. Also, the description of exemplary embodiments is intended to be illustrative, and not to limit the scope of the claims, and many alternatives, modifications, and variations will be apparent to those skilled in the art.

What is claimed is:

1. A display apparatus comprising:
    a display module comprising light emitting diode (LED) pixels, each of the LED pixels comprising at least a red LED, a green LED, and a blue LED; and
    a processor configured to:
        drive the display module by applying a luminance correction coefficient to each of the LED pixels included in the display module; and
        compensate the luminance correction coefficient for target LED pixels, from among LED pixels positioned along a first side of the display module, that are spaced apart from each other by at least one LED pixel,
    wherein a distance between the at least one LED pixel and another LED pixel adjacent to the at least one LED pixel is predetermined.

2. The display apparatus as claimed in claim 1, wherein the processor is further configured to:
    compensate the luminance correction coefficient based on the distance between the at least one LED pixel and the another LED pixel and a distance between the display module and another display module adjacent to the display module.

3. The display apparatus as claimed in claim 2, wherein the processor is further configured to:
    compensate the luminance correction coefficient based on the distance between the at least one LED pixel and the another LED pixel, the distance between the display module and the another display module, luminance of the LED pixels included in the display module, and luminance of LED pixels included in the another display module.

4. The display apparatus as claimed in claim 1, wherein the processor is further configured to:
    compensate the luminance correction coefficient based on a target luminance obtained based on luminance of the LED pixels included in the display module and luminance of LED pixels included in another display module adjacent to the display module.

5. The display apparatus as claimed in claim 4, wherein the target luminance corresponds to a compensation grayscale value to compensate a difference between the distance between the at least one LED pixel and the another LED pixel, and a distance between the display module and the another display module.

6. The display apparatus as claimed in claim 5, wherein the compensation grayscale value is identified by modeling a distribution of light intensity by the LED pixels included in the another display module and the LED pixels included in the display module.

7. The display apparatus as claimed in claim 1, wherein the processor is further configured to:
    compensate luminance correction coefficient for each of the target LED pixels spaced apart by the at least one LED pixel, from among LED pixels positioned on at least one side of another display module adjacent to the display module, the at least one side of the another display module facing the at least one side of the display module,
    wherein the target LED pixels that are spaced by apart from each other by the at least one LED pixel in the display module are positioned on a different horizontal line from target LED pixels spaced apart from each other by the at least one LED pixel in the another display module, respectively.

8. The display apparatus as claimed in claim 1, wherein the processor is further configured to:
    compare a luminance value of each grayscale of an input image according to the compensation of the luminance correction coefficient, correct a grayscale value of the input image, and render an output image based on the corrected grayscale value.

9. The display apparatus as claimed in claim 8, wherein the processor is further configured to:
    based on the grayscale value of an image displayed on the at least one LED pixel being less than or equal to a predetermined grayscale value, correct the grayscale value of the input image and render the output image, and
    wherein the grayscale value of the input image is corrected such that the luminance value adjusted according to the compensation of the luminance correction coefficient is adjusted upward or downward based on the grayscale value of the image displayed on the at least one LED pixel.

10. The display apparatus as claimed in claim 1, wherein the LED pixels included in the display module are arranged in a matrix form.

11. A controlling method of an electronic apparatus for obtaining a luminance correction coefficient corresponding to light emitting diode (LED) pixels included in a display module, each of the LED pixels comprising at least at least a red LED, a green LED, and a blue LED, the method comprising:
    driving the display module by applying the luminance correction coefficient to each of the LED pixels included in the display module; and
    compensating the luminance correction coefficient for target LED pixels, from among LED pixels positioned along a first side of the display module, that are spaced apart from each other by at least one LED pixel,
    wherein a distance between the at least one LED pixel and another LED pixel adjacent to the at least one LED pixel is predetermined.

12. The method as claimed in claim 11, wherein the compensating the luminance correction coefficient comprises:
    compensating the luminance correction coefficient based on the distance between the at least one LED pixel and the another LED pixel and a distance between the display module and another display module adjacent to the display module.

13. The method as claimed in claim 12, wherein the compensating the luminance correction coefficient comprises:
    compensating the luminance correction coefficient based on the distance between the at least one LED pixel and the another LED pixel, the distance between the display module and the another display module, luminance of the LED pixels included in the display module and luminance of the LED pixels included in the another display module.

14. The method as claimed in claim 11, wherein the compensating the luminance correction coefficient comprises:

compensating the luminance correction coefficient based on a target luminance obtained based on luminance of the LED pixels included in the display module and luminance of LED pixels included in another display module adjacent to the display module.

15. The method as claimed in claim 14, wherein the target luminance corresponds to a compensation grayscale value to compensate a difference between the distance between the at least one LED pixel and the another LED pixel, and a distance between the display module and the another display module.

16. The method as claimed in claim 15, wherein the compensation grayscale value is identified by modeling a distribution of light intensity by the LED pixels included in the another display module and the LED pixels included in the display module.

17. The method as claimed in claim 11, wherein the compensating the luminance correction coefficient comprising:

compensating luminance correction coefficient for each of the target LED pixels spaced apart by the at least one LED pixel, from among LED pixels positioned on at least one side of another display module adjacent to the display module, the at least one side of the another display module facing the at least one side of the display module, wherein the target LED pixels that are spaced apart from each other by the at least one LED pixel in the display module are positioned on a different horizontal line from target LED pixels spaced apart from each other by the at least one LED pixel in the another display module, respectively.

18. The method as claimed in claim 11, further comprising:

comparing a luminance value of each grayscale of an input image according to the compensation of the luminance correction coefficient;

correcting a grayscale value of the input image; and rendering an output image based on the corrected grayscale value.

19. The method as claimed in claim 18, further comprising:

based on the grayscale value of an image displayed on the at least one LED pixel being less than or equal to a predetermined grayscale value, correcting the grayscale value of the input image and render the output image, wherein the grayscale value of the input image is corrected such that the luminance value adjusted according to the compensation of the luminance correction coefficient is adjusted upward or downward based on the grayscale value of the image displayed on the at least one LED pixel.

20. The method as claimed in claim 11, wherein the LED pixels included in the display module are arranged in a matrix form.

* * * * *